US011581379B2

(12) United States Patent
Lee et al.

(10) Patent No.: US 11,581,379 B2
(45) Date of Patent: Feb. 14, 2023

(54) DISPLAY PANEL HAVING A FIRST CONDUCTIVE LAYER CONNECTING THE FIRST PIXEL ELECTRODE TO THE FIRST SYNCHRONIZATION PIXEL ELECTRODE

(71) Applicant: SAMSUNG DISPLAY CO., LTD., Yongin-si (KR)

(72) Inventors: Sanghoon Lee, Yongin-si (KR); Taewoo Kim, Yongin-si (KR); Kinyeng Kang, Yongin-si (KR); Taehoon Yang, Yongin-si (KR); Seunghwan Cho, Yongin-si (KR); Jonghyun Choi, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 11 days.

(21) Appl. No.: 16/922,218

(22) Filed: Jul. 7, 2020

(65) Prior Publication Data
US 2021/0143237 A1    May 13, 2021

(30) Foreign Application Priority Data

Nov. 7, 2019    (KR) .................. 10-2019-0141895

(51) Int. Cl.
*H01L 27/32* (2006.01)
*H01L 51/00* (2006.01)

(52) U.S. Cl.
CPC ...... *H01L 27/3248* (2013.01); *H01L 27/3202* (2013.01); *H01L 27/3211* (2013.01); *H01L 27/3276* (2013.01); *H01L 51/0096* (2013.01)

(58) Field of Classification Search
CPC ............. H01L 27/3202; H01L 27/3211; H01L 27/3248; H01L 27/3276
(Continued)

(56) References Cited

U.S. PATENT DOCUMENTS 7,830,591 B2    11/2010 Shimodaira
8,350,792 B2    1/2013 Igeta et al.
(Continued)

FOREIGN PATENT DOCUMENTS

JP    2010032760 A    2/2010
KR    101567424 B1    11/2015
(Continued)

*Primary Examiner* — Hoai V Pham
(74) *Attorney, Agent, or Firm* — Cantor Colburn LLP

(57) ABSTRACT

A display panel having improved product reliability includes a substrate including an opening area, a synchronization display area surrounding the opening area, and a display area arranged on a periphery of the synchronization display area, a plurality of signal lines arranged over the substrate, a first sub-pixel including a first pixel electrode arranged in the display area and a first intermediate layer which is arranged on the first pixel electrode and emits light having a first wavelength, a first synchronization sub-pixel including a first synchronization pixel electrode arranged in the synchronization display area and a first synchronization intermediate layer which is arranged on the first synchronization pixel electrode and emits light having the first wavelength as the first sub-pixel, and a first conductive layer connecting the first pixel electrode to the first synchronization pixel electrode.

20 Claims, 16 Drawing Sheets

(58) Field of Classification Search
USPC .......................................................... 257/40
See application file for complete search history.

(56) References Cited

U.S. PATENT DOCUMENTS

| | | | |
|---|---|---|---|
| 8,665,295 | B2 | 3/2014 | Leon et al. |
| 10,134,826 | B2 | 11/2018 | Ka et al. |
| 2017/0287992 | A1 | 10/2017 | Kwak et al. |
| 2021/0013297 | A1* | 1/2021 | Okabe ........................ G09F 9/30 |

FOREIGN PATENT DOCUMENTS

| | | |
|---|---|---|
| KR | 1020170111827 A | 10/2017 |
| KR | 1020170137230 A | 12/2017 |

* cited by examiner

DISPLAY PANEL HAVING A FIRST CONDUCTIVE LAYER CONNECTING THE FIRST PIXEL ELECTRODE TO THE FIRST SYNCHRONIZATION PIXEL ELECTRODE

This application claims priority to Korean Patent Application No. 10-2019-0141895, filed on Nov. 7, 2019, and all the benefits accruing therefrom under 35 U.S.C. § 119, the content of which in its entirety is herein incorporated by reference.

BACKGROUND

1. Field

Exemplary embodiments relate to a display panel, and more particularly, to a display panel having improved product reliability.

2. Description of Related Art

Recently, display apparatuses are used for various purposes. Also, display apparatuses become thinner and lighter, and thus tend to have a wider range of uses.

As display apparatuses are used in various ways, various methods of designing forms of display apparatuses are developed, and further, functions that may be added to or associated with display apparatuses are increasing.

SUMMARY

As a method of increasing functions that may be added to or associated with a display apparatus, one or more embodiments include a display panel including areas where a camera, a sensor, etc. may be arranged inside a display area.

Additional features will be set forth in part in the description which follows and, in part, will be apparent from the description, or may be learned by practice of the presented embodiments of the invention.

An exemplary embodiment of a display panel includes a substrate including an opening area, a synchronization display area surrounding the opening area, and a display area arranged on a periphery of the synchronization display area, a plurality of signal lines arranged over the substrate, a first sub-pixel including a first pixel electrode arranged in the display area and a first intermediate layer which is arranged on the first pixel electrode and emits light having a first wavelength, a first synchronization sub-pixel including a first synchronization pixel electrode arranged in the synchronization display area and a first synchronization intermediate layer which is arranged on the first synchronization pixel electrode and emits light having the first wavelength as the first sub-pixel, and a first conductive layer connecting the first pixel electrode to the first synchronization pixel electrode.

In an exemplary embodiment, the display panel may further include a second sub-pixel including a second pixel electrode arranged in the display area and a second intermediate layer which is arranged on the second pixel electrode and emits light having a second wavelength, a second synchronization sub-pixel including a second synchronization pixel electrode arranged in the synchronization display area and a second synchronization intermediate layer which is arranged on the second synchronization pixel electrode and emits light having the second wavelength as the second sub-pixel, and a second conductive layer connecting the second pixel electrode to the second synchronization pixel electrode.

In an exemplary embodiment, the display panel may further include a third sub-pixel including a third pixel electrode arranged in the display area and a third intermediate layer which is arranged on the third pixel electrode and emits light having a third wavelength, a third synchronization sub-pixel including a third synchronization pixel electrode arranged in the synchronization display area and a third synchronization intermediate layer which is arranged on the third synchronization pixel electrode and emits light having the third wavelength as the third sub-pixel, and a third conductive layer connecting the third pixel electrode to the third synchronization pixel electrode.

In an exemplary embodiment, the first pixel electrode and the first conductive layer may include a same material, the second pixel electrode and the second conductive layer may include a same material, and the third pixel electrode and the third conductive layer may include a same material.

In an exemplary embodiment, the first synchronization sub-pixel, the second synchronization sub-pixel, and the third synchronization sub-pixel may be arranged in the synchronization display area to surround the opening area.

In an exemplary embodiment, the first sub-pixel, the second sub-pixel, and the third sub-pixel may be arranged in the display area to surround the synchronization display area.

In an exemplary embodiment, the first synchronization sub-pixel, the second synchronization sub-pixel, and the third synchronization sub-pixel may at least partially overlap the plurality of signal lines and may be arranged over the substrate.

In an exemplary embodiment, the display panel may further include a planarization layer which is arranged over the substrate and in which a first contact hole, a second contact hole, and a third contact hole, are defined wherein the first sub-pixel may further include a first pixel circuit electrically connected to the first pixel electrode via the first contact hole, the second sub-pixel may further include a second pixel circuit electrically connected to the second pixel electrode via the second contact hole, and the third sub-pixel may further include a third pixel circuit electrically connected to the third pixel electrode via the third contact hole.

In an exemplary embodiment, each of the first pixel circuit, the second pixel circuit, and the third pixel circuit may include a thin film transistor including a semiconductor layer, a gate electrode insulated from the semiconductor layer, and a source electrode and a drain electrode insulated from the gate electrode, and a storage capacitor including a lower electrode and an upper electrode arranged over the lower electrode.

In an exemplary embodiment, the plurality of signal lines may include first signal lines extending in a first direction and including a bypass portion around an edge of the opening area, wherein the first signal lines may include a same material as a material of the gate electrode.

In an exemplary embodiment, the plurality of signal lines may include second signal lines extending in the first direction and including a bypass portion around the edge of the opening area, wherein the second signal lines may include a same material as a material of the upper electrode.

In an exemplary embodiment, the plurality of signal lines may include third signal lines extending in a second direction crossing the first direction and including a bypass portion around the edge of the opening area, wherein neighboring third signal lines from among the third signal lines may be arranged on different layers from each other.

In an exemplary embodiment, the display panel may further include a partition wall arranged in the synchronization display area to surround the opening area.

In an exemplary embodiment, the display panel may further include at least one groove arranged in the synchronization display area to surround the opening area, wherein the at least one groove may include a first groove adjacent to the display area with respect to the partition wall, and a second groove adjacent to the opening area.

In an exemplary embodiment, the display panel may further include a thin film encapsulation layer arranged on the first sub-pixel, the second sub-pixel, and the third sub-pixel and including at least one inorganic encapsulation layer and at least one organic encapsulation layer, wherein the at least one organic encapsulation layer may extend to the synchronization display area and cover the first groove.

An exemplary embodiment of a display panel includes a substrate including an opening area, a synchronization display area surrounding the opening area, and a display area arranged on a periphery of the synchronization display area, a plurality of signal lines arranged over the substrate, a sub-pixel including a pixel electrode arranged in the display area, an intermediate layer arranged on the pixel electrode, and an opposite electrode arranged on the intermediate layer and at least partially extending to the synchronization display area, a synchronization sub-pixel including a synchronization pixel electrode arranged in the synchronization display area, a synchronization intermediate layer arranged on the synchronization pixel electrode, and the opposite electrode which is arranged on the synchronization intermediate layer and emits light having a same wavelength as a wavelength of the sub-pixel, and a conductive layer connecting the pixel electrode to the synchronization pixel electrode.

In an exemplary embodiment, the sub-pixel may include a first sub-pixel, a second sub-pixel, and a third sub-pixel, and the synchronization sub-pixel may include a first synchronization sub-pixel, a second synchronization sub-pixel, and a third synchronization sub-pixel, wherein the first sub-pixel and the first synchronization sub-pixel may emit light having a first wavelength, the second sub-pixel and the second synchronization sub-pixel may emit light having a second wavelength, and the third sub-pixel and the third synchronization sub-pixel may emit light having a third wavelength.

In an exemplary embodiment, the first synchronization sub-pixel, the second synchronization sub-pixel, and the third synchronization sub-pixel may be arranged in the synchronization display area to surround the opening area.

In an exemplary embodiment, the first sub-pixel, the second sub-pixel, and the third sub-pixel may be arranged in the display area to surround the synchronization display area.

In an exemplary embodiment, the first synchronization sub-pixel, the second synchronization sub-pixel, and the third synchronization sub-pixel may at least partially overlap the plurality of signal lines and may be arranged over the substrate.

BRIEF DESCRIPTION OF THE DRAWINGS

The above and other features and advantages of exemplary embodiments of the invention will be more apparent from the following description taken in conjunction with the accompanying drawings, in which.

DETAILED DESCRIPTION

Figure 1:
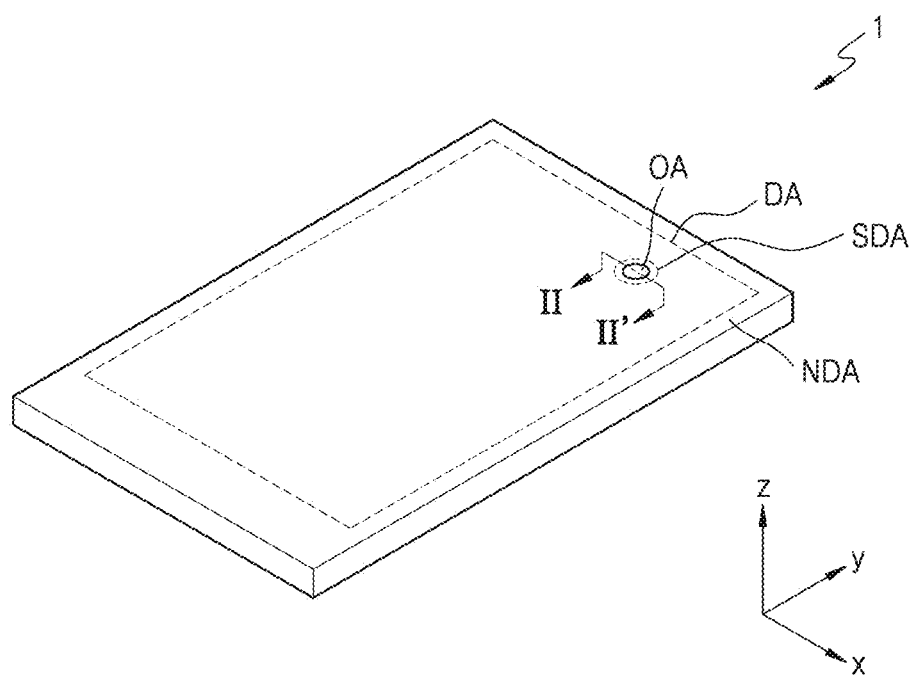
FIG. 1 is a schematic perspective view of an exemplary embodiment of a display apparatus.

Reference will now be made in detail to embodiments, examples of which are illustrated in the accompanying drawings, wherein like reference numerals refer to like elements throughout. In this regard, the invention may have different forms and should not be construed as being limited to the descriptions set forth herein. Accordingly, the exemplary embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will be described in detail with reference to the accompanying drawings, wherein like reference numerals refer to like elements throughout and a repeated description thereof is omitted.

While such terms as "first" and "second" may be used to describe various components, such components must not be limited to the above terms. The above terms are used only to distinguish one component from another. The singular forms "a," "an," and "the" as used herein are intended to include the plural forms as well unless the context clearly indicates otherwise.

It will be understood that the terms "comprise," "include," and "have" as used herein specify the presence of stated features or components but do not preclude the presence or addition of one or more other features or components. It will be further understood that, when a layer, region, or component is referred to as being "on" another layer, region, or component, it can be directly or indirectly on the other layer, region, or component. That is, for example, intervening layers, regions, or components may be present.

Sizes of components in the drawings may be exaggerated or reduced for convenience of explanation. Since sizes and thicknesses of components in the drawings, for example, are arbitrarily illustrated for convenience of explanation, the invention is not limited thereto.

The x-axis, the y-axis and the z-axis are not limited to three axes of the rectangular coordinate system and may be interpreted in a broader sense. The x-axis, the y-axis, and the z-axis may be perpendicular to one another or may represent different directions that are not perpendicular to one another, for example.

When an exemplary embodiment may be implemented differently, a certain process order may be performed differently from the described order. Two consecutively described processes may be performed substantially at the same time or performed in an order opposite to the described order, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a schematic perspective view of an exemplary embodiment of a display apparatus 1.

Referring to FIG. 1, the display apparatus 1 may include a display area DA emitting light and a non-display area NDA emitting no light. The display apparatus 1 may provide a predetermined image by light emitted from a plurality of sub-pixels arranged in the display area DA.

The display apparatus 1 may include an opening area OA. The opening area OA may be at least partially surrounded by a synchronization display area SDA, and the synchronization display area SDA may be at least partially surrounded by the display area DA. In an exemplary embodiment, FIG. 1 shows the opening area OA entirely surrounded by the synchronization display area SDA and the synchronization display area SDA entirely surrounded by the display area DA.

Figure 2:
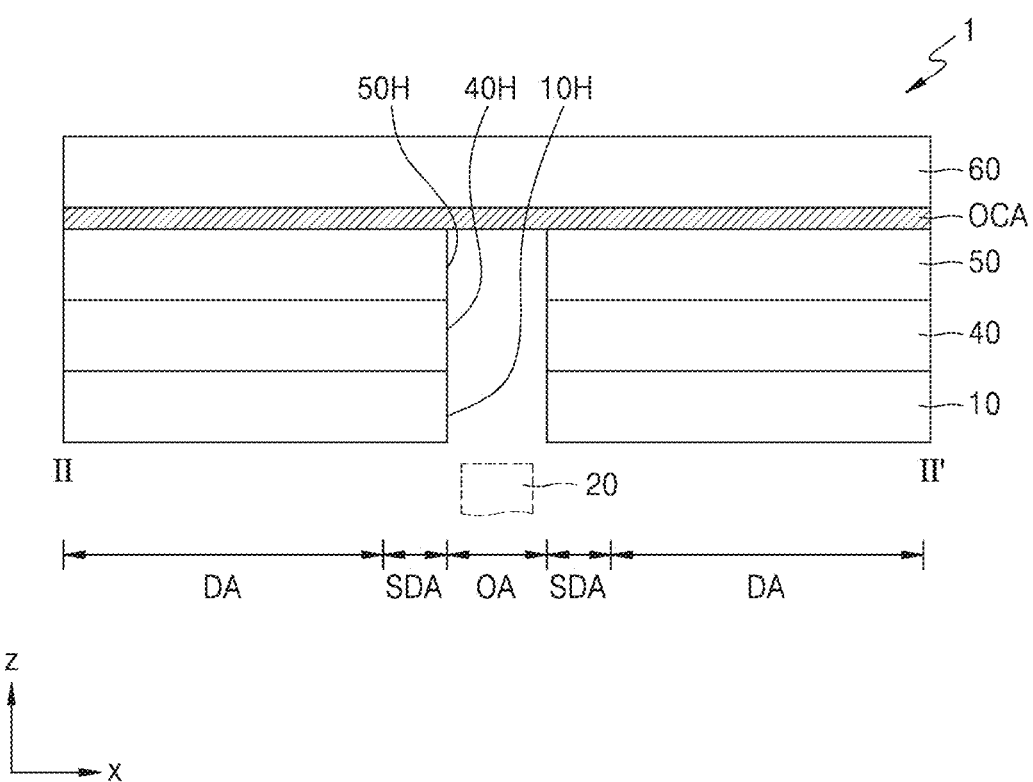
FIG. 2 is a schematic cross-sectional view of an exemplary embodiment of a display apparatus, taken along line II-II' of FIG. 1.

As shown in FIG. 2 described below, the opening area OA may be a location where an electronic element is arranged. The opening area OA may be understood as a transmission area capable of transmitting light and/or sound output from an electronic element to the outside or travelling from the outside towards an electronic element. In an exemplary embodiment, when light passes through the opening area OA, light transmittance may be about 50 percent (%) or greater, about 70% or greater, about 75% or greater, about 80% or greater, about 85% or greater, or about 90% or greater, for example.

Although an organic light-emitting display apparatus is described below in an exemplary embodiment of the display apparatus 1, a display apparatus according to the invention is not limited thereto. In another exemplary embodiment, a display apparatus according to the invention may be a display apparatus such as an inorganic light-emitting display apparatus (or an inorganic electroluminescence ("EL") display apparatus) or a quantum dot light-emitting display apparatus. In an exemplary embodiment, an emission layer of a display element included in the display apparatus 1 may include an organic material, may include an inorganic material, may include quantum dots, may include an organic material and quantum dots, or may include an inorganic material and quantum dots, for example.

Although FIG. 1 shows the opening area OA arranged on a side (an upper right side) of the display area DA having a quadrilateral shape, the invention is not limited thereto. In other exemplary embodiments, the display area DA may have a circular shape, an oval shape, or a polygonal shape such as a triangular shape or a pentagonal shape, and a location of the opening area OA may also be variously changed, for example.

FIG. 2 is a schematic cross-sectional view of an exemplary embodiment of the display apparatus 1, taken along line II-II' of FIG. 1.

Referring to FIG. 2, the display apparatus 1 may include a display panel 10 and an input sensing layer 40 and an optical function layer 50 arranged on the display panel 10, and the display panel 10, the input sensing layer 40, and the optical function layer 50 may be covered by a window 60. The window 60 may be combined with a component under the window 60, for example, the optical function layer 50, through an adhesive layer such as an optically clear adhesive OCA. In exemplary embodiments, the display apparatus 1 may be included in various electronic devices such as a cellular phone, a tablet personal computer ("PC"), a notebook computer, or a smartwatch.

The display panel 10 may include a plurality of diodes arranged in the display area DA. The input sensing layer 40 may obtain coordinate information according to an external input, for example, a touch event. The input sensing layer 40 may include a sensing electrode and tracing lines connected to the sensing electrode. The input sensing layer 40 may be arranged on the display panel 10. The input sensing layer 40 may sense an external input by a mutual capacitance method or a self-capacitance method.

The input sensing layer 40 may be directly arranged on the display panel 10. In an alternative exemplary embodiment, the input sensing layer 40 may be combined with the display panel 10 through an adhesive layer such as the optically clear adhesive OCA. In an exemplary embodiment, as shown in FIG. 2, the input sensing layer 40 may be directly arranged on the display panel 10, and in this case, there may be no adhesive layer between the input sensing layer 40 and the display panel 10.

The optical function layer 50 may include a reflection-preventing layer. The reflection-preventing layer may decrease reflectance of light (external light) incident on the window 60 in a direction from the outside towards the display panel 10. The reflection-preventing layer may include a phase retarder and a polarizer. In an exemplary embodiment, the phase retarder may be a film type or a liquid crystal coating type and may include a $\lambda/2$ phase retarder and/or a $\lambda/4$ phase retarder, for example. In an exemplary embodiment, the polarizer may also be a film type or a liquid crystal coating type, for example. In an exemplary embodiment, the film type may include an elongation-type synthetic resin film, and the liquid crystal coating type may include liquid crystals arranged in a predetermined arrangement, for example. The phase retarder and the polarizer may further include a protection film.

In another exemplary embodiment, the reflection-preventing layer may include a structure of black matrix and color filters. The color filters may be arranged by taking into account color of light emitted from each sub-pixel of the display panel 10. In another exemplary embodiment, the reflection-preventing layer may include a destructive interference structure. The destructive interference structure may include a first reflection layer and a second reflection layer arranged on different layers from each other. First reflected light and second reflected light respectively reflected from the first reflection layer and the second reflection layer may be subject to destructive interference, and accordingly, external light reflectance may decrease.

The optical function layer 50 may include a lens layer. The lens layer may increase light output efficiency of light emitted from the display panel 10 or may decrease color chrominance. The lens layer may include a layer having a concave or convex lens shape and/or may include a plurality of layers having different refractive indexes from each other. The optical function layer 50 may include both of the reflection-preventing layer and the lens layer described above or may include one of the reflection-preventing layer and the lens layer.

An opening corresponding to the opening area OA may be defined in the display panel 10, the input sensing layer 40 and/or the optical function layer 50. In this regard, FIG. 2 shows a structure in which first to third openings 10H, 40H, and 50H are respectively defined in the display panel 10, the input sensing layer 40, and the optical function layer 50, and the first to third openings 10H, 40H, and 50H overlap one another.

In another exemplary embodiment, an opening may not be defined in at least one of the display panel 10, the input sensing layer 40, or the optical function layer 50. In an exemplary embodiment, an opening may not be defined in one or two of the display panel 10, the input sensing layer 40, and the optical function layer 50. In an alternative exemplary embodiment, an opening may not be defined in the display panel 10, the input sensing layer 40, and the optical function layer 50.

When an adhesive layer between the window 60 and the optical function layer 50 includes the optically clear adhesive OCA, a hole corresponding to the opening area OA may not be defined in the adhesive layer.

A component 20 may be arranged in the opening area OA. The component 20 may include an electronic element. In an exemplary embodiment, the component 20 may be an electronic element using light or sound, for example. In an exemplary embodiment, the electronic element may include a sensor, such as an infrared sensor, receiving and using light, a camera receiving light to capture an image, a sensor outputting and sensing light or sound to measure a distance or recognize a fingerprint, a small lamp outputting light, or a speaker outputting sound, for example. The electronic element using light may use light within various wavelength ranges, such as visible light, infrared light, ultraviolet light, etc. In some exemplary embodiments, the opening area OA may be understood as a transmission area capable of transmitting light output from the component 20 to the outside or travelling from the outside toward the electronic element.

In another exemplary embodiment, when the display apparatus 1 is used as a smartwatch or a vehicle-use dashboard, the component 20 may be a member such as clock hands or a needle indicating predetermined information (e.g. a vehicle speed, etc.). When the display apparatus 1 includes clock hands or a vehicle-use dashboard, the component 20 may be externally exposed through the window 60, and an opening corresponding to the opening area OA may be defined in the window 60.

As described above, the component 20 may include a component (components) that may add a predetermined function to the display apparatus 1 or may include a component such as an accessory increasing an aesthetic sense of the display panel 10.

Figure 3:
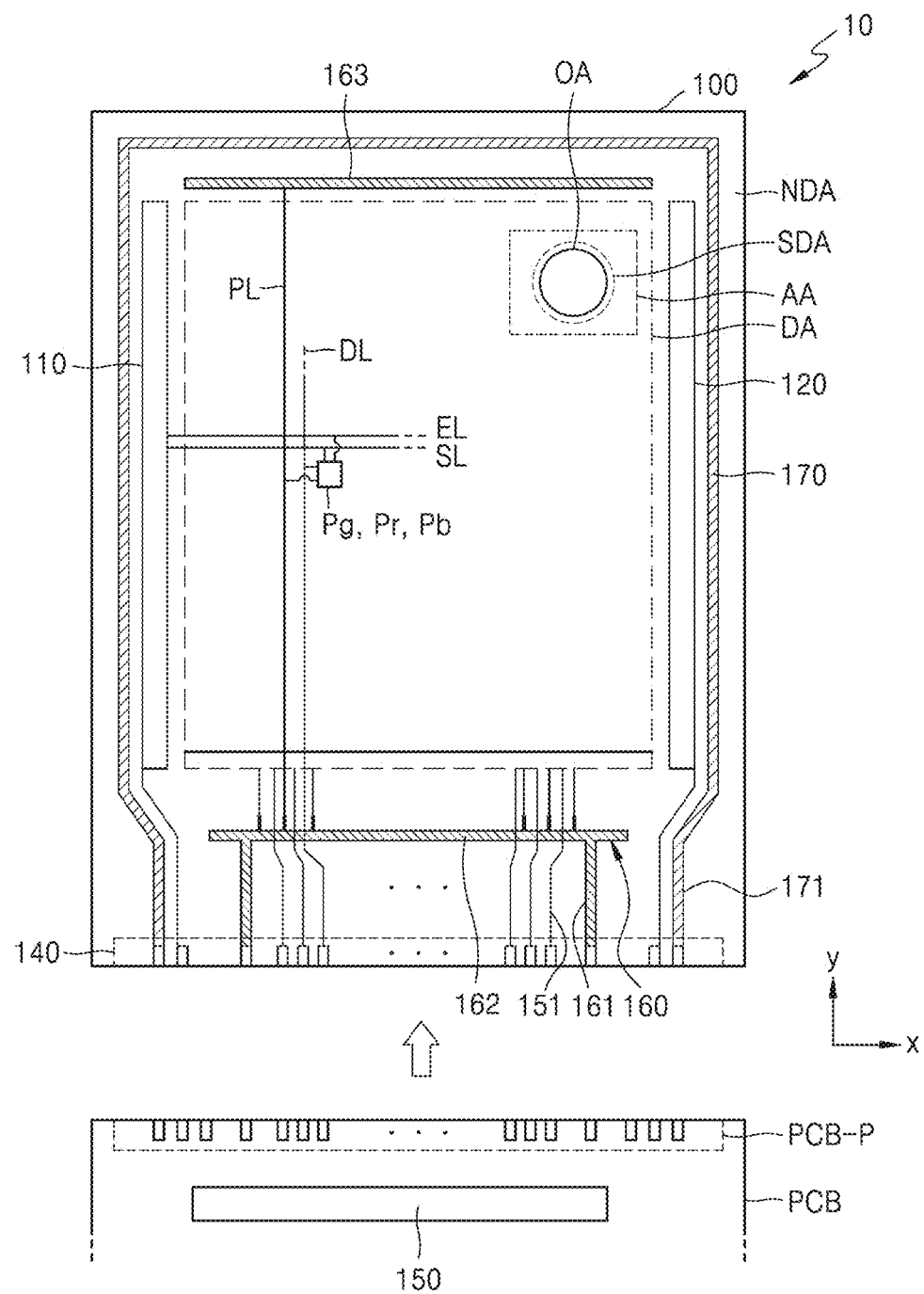
FIG. 3 is a schematic plan view of an exemplary embodiment of a display panel.

FIG. 3 is a schematic plan view of an exemplary embodiment of the display panel 10.

Referring to FIG. 3, the display panel 10 may include a plurality of sub-pixels arranged in the display area DA. The plurality of sub-pixels may each include a display element such as an organic light-emitting diode. Each sub-pixel may emit, for example, red, green, blue, or white light, through the organic light-emitting diode. A sub-pixel described herein may be understood as a sub-pixel which emits one of red light, green light, blue light, and white light as described above.

The opening area OA may be arranged inside the display area DA, and the plurality of sub-pixels may be arranged around the opening area OA. The plurality of sub-pixels may be arranged in the display area DA to surround the opening area OA, and the synchronization display area SDA, where synchronization sub-pixels are arranged, may be between the opening area OA and the display area DA.

Each sub-pixel is electrically connected to peripheral circuits arranged in the non-display area NDA. A first scan driving circuit 110, a second scan driving circuit 120, a terminal 140, a data driving circuit 150, a first power supply wire 160, and a second power supply wire 170 may be arranged in the non-display area NDA.

The first scan driving circuit 110 may provide a scan signal to each sub-pixel Pb, Pg, and Pr via a scan line SL. The first scan driving circuit 110 may provide an emission control signal to each sub-pixel Pb, Pg, and Pr via an emission control line EL. The second scan driving circuit 120 may be parallel to the first scan driving circuit 110 with the display area DA therebetween. Some of the sub-pixels Pb, Pg, and Pr arranged in the display area DA may be electrically connected to the first scan driving circuit 110, and the others may be connected to the second scan driving circuit 120. In another exemplary embodiment, the second scan driving circuit 120 may be omitted.

The terminal 140 may be arranged on a side of a substrate 100. The terminal 140 may not be covered by an insulating layer but may be exposed and electrically connected to a printed circuit board PCB. A terminal PCB-P of the printed circuit board PCB may be electrically connected to the terminal 140 of the display panel 10. The printed circuit board PCB transmits a signal or power of a controller (not shown) to the display panel 10. Control signals generated from the controller may be transmitted to the first and second scan driving circuits 110 and 120, respectively, through the printed circuit board PCB. The controller may provide first power ELVDD and second power ELVSS (refer to FIG. 5 described below) to the first and second power supply wires 160 and 170, respectively, via first and second connection wires 161 and 171. The first power ELVDD may be provided to each sub-pixel via a driving voltage line PL connected to the first power supply wire 160, and the second power ELVSS may be provided to an opposite electrode of each sub-pixel connected to the second power supply wire 170.

The data driving circuit 150 is electrically connected to a data line DL. A data signal of the data driving circuit 150 may be provided to each sub-pixel Pb, Pg, and Pr via a connection wire 151 connected to the terminal 140 and the data line DL connected to the connection wire 151. FIG. 3 shows the data driving circuit 150 arranged on the printed circuit board PCB. However, in another exemplary embodiment, the data driving circuit 150 may be arranged on the substrate 100. In an exemplary embodiment, the data driving circuit 150 may be arranged between the terminal 140 and the first power supply wire 160, for example.

The first power supply wire 160 may include a first sub-wire 162 and a second sub-wire 163 extending parallel to each other in a first direction (direction x) with the display area DA therebetween. The second power supply wire 170 may partially surround the display area DA in a loop having one side open.

Figure 4:
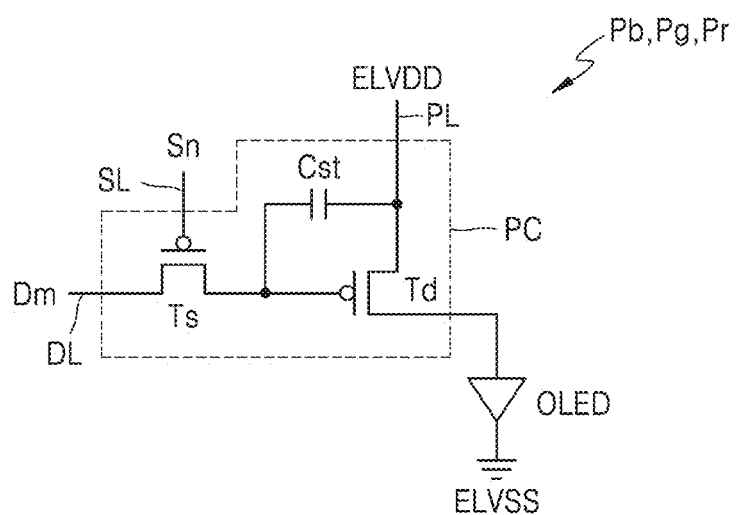
FIGS. 4 and 5 are equivalent circuit diagrams showing an exemplary embodiment of one sub-pixel of a display panel.
Figure 5:
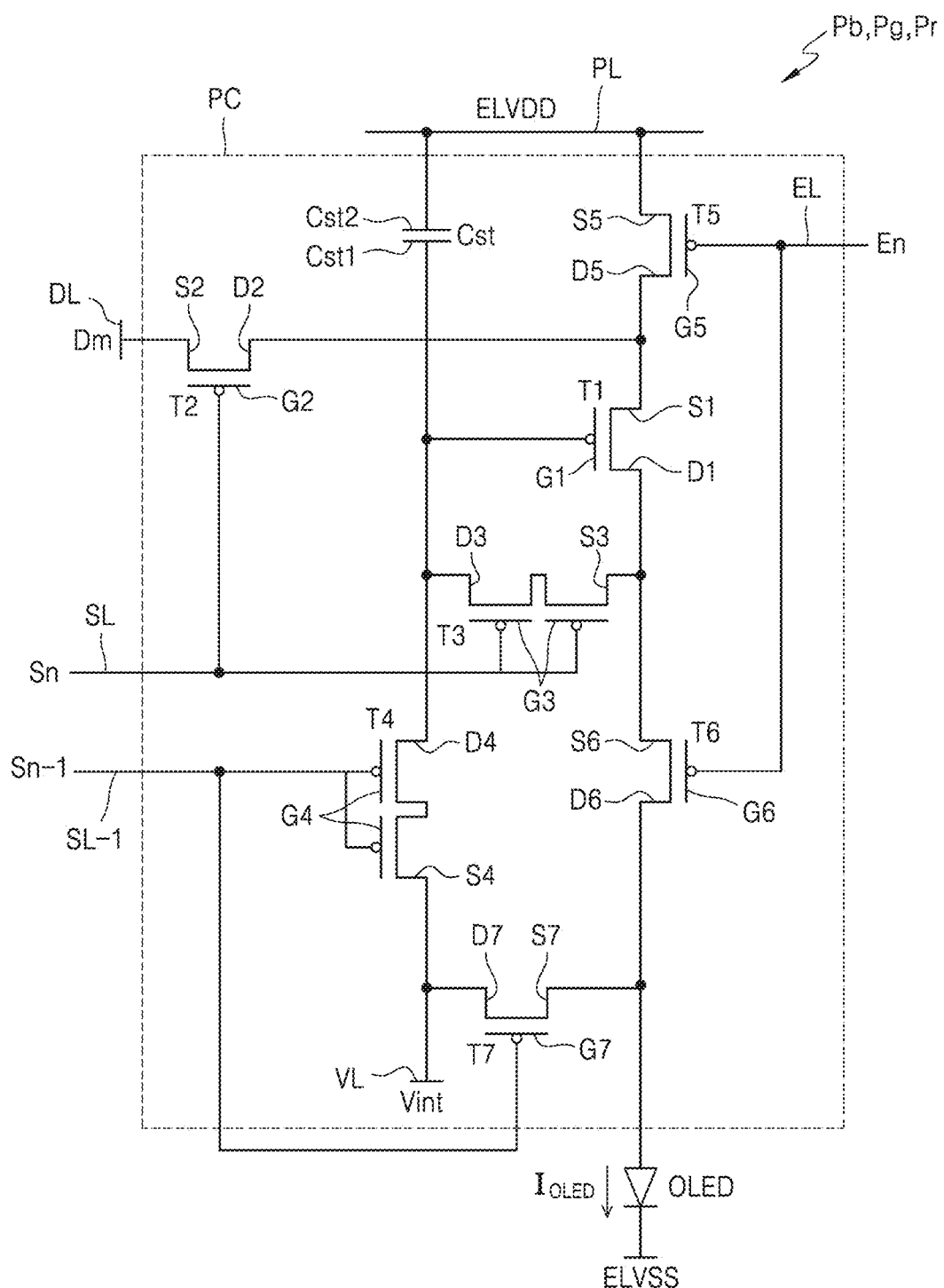

FIGS. 4 and 5 are equivalent circuit diagrams showing an exemplary embodiment of one sub-pixel of a display panel.

Referring to FIG. 4, each sub-pixel Pb, Pg, and Pr may include a pixel circuit PC connected to the scan line SL and the data line DL, and an organic light-emitting diode OLED connected to the pixel circuit PC. The pixel circuit PC may include a driving thin film transistor Td, a switching thin film transistor Ts, and a storage capacitor Cst. The switching thin film transistor Ts may be connected to the scan line SL and the data line DL and may transmit a data signal Dm input via the data line DL to the driving thin film transistor Td according to a scan signal Sn input via the scan line SL.

The storage capacitor Cst may be connected to the switching thin film transistor Ts and the driving voltage line PL and may store a voltage corresponding to a difference between a voltage received from the switching thin film transistor Ts and a first power voltage supplied to the driving voltage line PL.

The driving thin film transistor Td may be connected to the driving voltage line PL and the storage capacitor Cst and may control a driving current flowing through the organic light-emitting diode OLED from the driving voltage line PL in response to a voltage value stored in the storage capacitor Cst. The organic light-emitting diode OLED may emit light having predetermined brightness according to the driving current.

Although a case in which the pixel circuit PC includes two thin film transistors and one storage capacitor has been described with reference to FIG. 4, the invention is not limited thereto. As shown in FIG. 5, the pixel circuit PC may include seven thin film transistors and one storage capacitor. Although FIG. 5 shows the pixel circuit PC including one storage capacitor, the pixel circuit PC may include two or more storage capacitors.

Referring to FIG. 5, each sub-pixel may include the pixel circuit PC and the organic light-emitting diode OLED connected to the pixel circuit PC. The pixel circuit PC may include a plurality of thin film transistors and a storage capacitor. The plurality of thin film transistors and the storage capacitor may be connected to signal lines, for example, the scan line SL, a previous scan line SL-1, the emission control line EL, and the data line DL, an initialization voltage line VL, and the driving voltage line PL.

Although FIG. 5 shows each sub-pixel connected to signal lines, for example, the scan line SL, the previous scan line SL-1, the emission control line EL, and the data line DL, the initialization voltage line VL, and the driving voltage line PL, the invention is not limited thereto. In another exemplary embodiment, at least one of signal lines, for example, the scan line SL, the previous scan line SL-1, the emission control line EL, and the data line DL, the initialization voltage line VL, and the driving voltage line PL may be shared among neighboring pixels.

The signal lines may include the scan line SL for transferring the scan signal Sn, the previous scan line SL-1 for transferring a previous scan signal Sn-1 to a first initialization thin film transistor T4 and a second initialization thin film transistor T7, the emission control line EL for transferring an emission control signal En to an operation control thin film transistor T5 and an emission control thin film transistor T6, and the data line DL which crosses the scan line SL and transfers the data signal Dm. The driving voltage line PL may transfer a driving voltage to a driving thin film transistor T1, and the initialization voltage line VL may transfer an initialization voltage Vint for initializing the driving thin film transistor T1 and a pixel electrode.

A driving gate electrode G1 of the driving thin film transistor T1 is connected to a lower electrode Cst1 of the storage capacitor Cst, a driving source electrode S1 of the driving thin film transistor T1 is connected to the driving voltage line PL via the operation control thin film transistor T5, and a driving drain electrode D1 of the driving thin film transistor T1 is electrically connected to a pixel electrode of the organic light-emitting diode OLED via the emission control thin film transistor T6. The driving thin film transistor T1 may receive the data signal Dm according to a switching operation of a switching thin film transistor T2 and supply a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and is also connected to the driving voltage line PL via the operation control thin film transistor T5. The switching thin film transistor T2 may be turned on according to the scan signal Sn received via the scan line SL to perform a switching operation for transmitting the data signal Dm transferred via the data line DL to the driving source electrode S1 of the driving thin film transistor T1.

A compensation gate electrode G3 of a compensation thin film transistor T3 is connected to the scan line SL, a compensation source electrode S3 of the compensation thin film transistor T3 is connected to the driving drain electrode D1 of the driving thin film transistor T1 and is also connected to the pixel electrode of the organic light-emitting diode OLED via the emission control thin film transistor T6, and a compensation drain electrode D3 of the compensation thin film transistor T3 is connected to the lower electrode Cst1 of the storage capacitor Cst, a first initialization drain electrode D4 of the first initialization thin film transistor T4, and the driving gate electrode G1 of the driving thin film transistor T1. The compensation thin film transistor T3 may be turned on according to the scan signal Sn received via the scan line SL to diode-connect the driving thin film transistor T1 by electrically connecting the driving gate electrode G1 and the driving drain electrode D1 of the driving thin film transistor T1 to each other.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and the first initialization drain electrode D4 of the first initialization thin film transistor T4 is connected to the lower electrode Cst1 of the storage capacitor Cst, the compensation drain electrode D3 of the compensation thin film transistor T3, and the driving gate electrode G1 of the driving thin film transistor T1. The first initialization thin film transistor T4 may be turned on according to the previous scan signal Sn-1 received via the previous scan line SL-1 to perform an initialization operation for initializing a voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be electrically connected to a second initialization source electrode S7 of the second initialization thin film transistor T7 and the pixel electrode of the organic light-emitting diode OLED.

As the operation control thin film transistor T5 and the emission control thin film transistor T6 are simultaneously turned on according to the emission control signal En received via the emission control line EL, the driving voltage ELVDD may be transmitted to the organic light-emitting diode OLED, and thus, the driving current $I_{OLED}$ may flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 may be turned on according to the previous scan signal Sn-1 received via the previous scan line SL-1 to initialize the pixel electrode of the organic light-emitting diode OLED.

Although FIG. 5 shows a case in which the first initialization thin film transistor T4 and the second initialization thin film transistor T7 are connected to the previous scan line SL-1, the invention is not limited thereto. In another exemplary embodiment, the first initialization thin film transistor T4 may be connected to the previous scan line SL-1 and be driven according to the previous scan signal Sn-1, and the second initialization thin film transistor T7 may be connected to a separate signal line (for example, a subsequent scan line) and be driven according to a signal transmitted to the separate signal line.

An upper electrode Cst2 of the storage capacitor Cst is connected to the driving voltage line PL, and an opposite electrode of the organic light-emitting diode OLED is connected to a common voltage. Accordingly, the organic light-emitting diode OLED may receive the driving current $I_{OLED}$ from the driving thin film transistor T1 and emit light, thereby displaying an image.

Although FIG. 5 shows the compensation thin film transistor T3 and the first initialization thin film transistor T4 each having a dual gate electrode, the compensation thin film transistor T3 and the first initialization thin film transistor T4 may each have one gate electrode.

Figure 6:
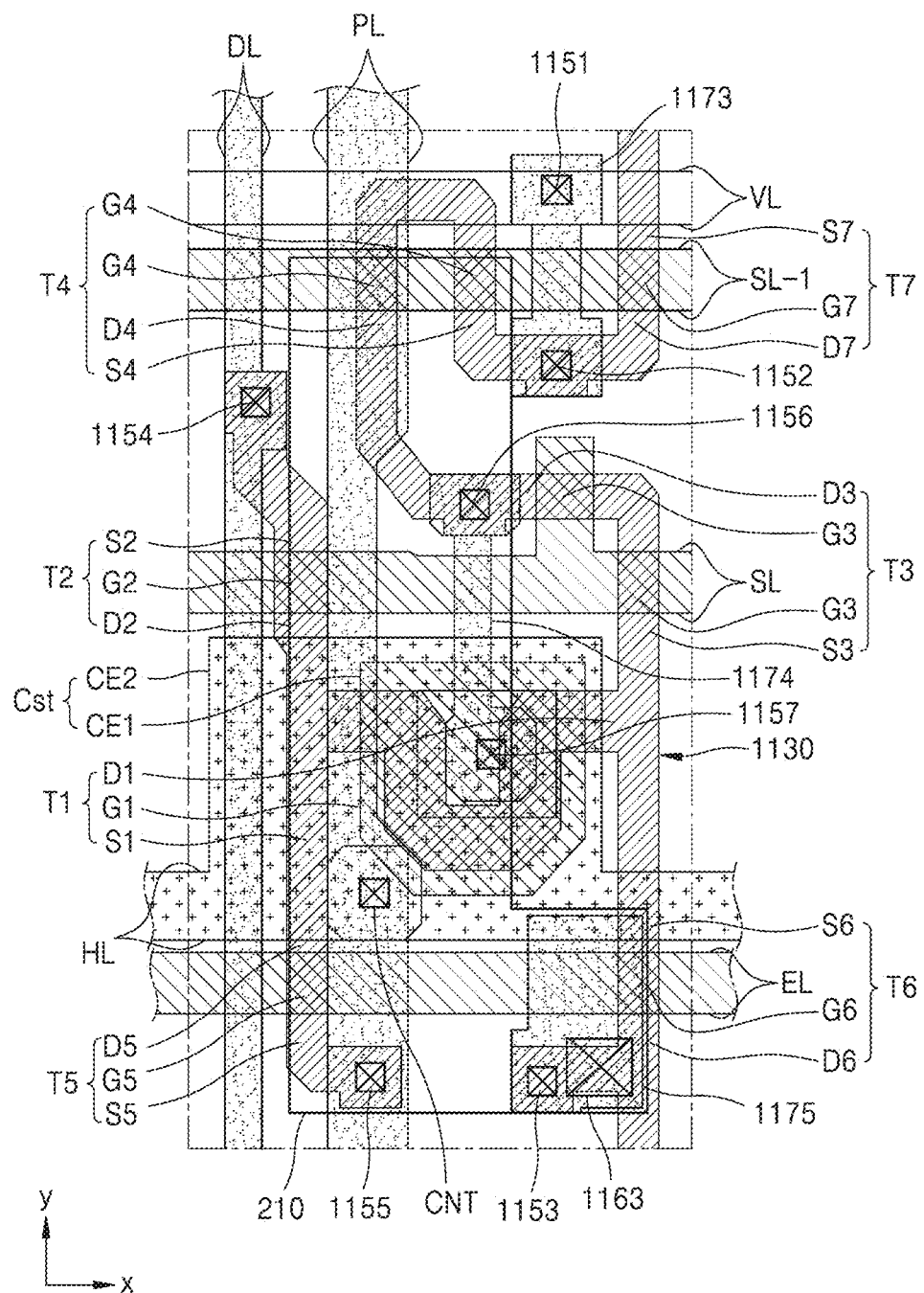
FIG. 6 is a plan view showing an exemplary embodiment of one sub-pixel of a display panel.

FIG. 6 is a plan view showing an exemplary embodiment of one sub-pixel of a display panel.

Referring to FIG. 6, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged along a semiconductor layer 1130.

The semiconductor layer 1130 is arranged over a substrate on which a buffer layer is disposed, and the buffer layer includes an inorganic insulating material. In the illustrated exemplary embodiment, the semiconductor layer 1130 may include low temperature polysilicon ("LTPS"). Polysilicon materials have low energy consumption and excellent reliability due to high electron mobility (100 square centimeters per volt per second ($cm^2$/Vs) or greater) and thus may be used as a semiconductor layer of a thin film transistor in a display apparatus. However, the invention is not limited thereto, and in another exemplary embodiment, the semiconductor layer 1130 may include amorphous silicon (a-Si) and/or an oxide semiconductor, or alternatively, some semiconductor layers of the plurality of thin film transistors may include LTPS and the other semiconductor layers may include a-Si and/or an oxide semiconductor.

Some areas of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be understood as being connected to one another and being curved in various shapes.

The semiconductor layer 1130 may include a channel region and source and drain regions on both sides of the channel region, and the source and drain regions may be understood as source and drain electrodes of a corresponding thin film transistor. Hereinafter, the source region and the drain region will be referred to as the source electrode and the drain electrode, respectively, for convenience of description.

The driving thin film transistor T1 includes the driving gate electrode G1 overlapping a driving channel region, and the driving source electrode S1 and the driving drain electrode D1 on both sides of the driving channel region. The driving channel region overlapping the driving gate electrode G1 may have a bent shape such as an omega shape, thereby forming a long channel length in a narrow space. When the driving channel region is long, a driving range of a gate voltage may widen, and thus, gradation of light emitted from the organic light-emitting diode OLED may be controlled more precisely, and display quality may be improved.

The switching thin film transistor T2 includes the switching gate electrode G2 overlapping a switching channel region, and the switching source electrode S2 and the switching drain electrode D2 on both sides of the switching channel region. The switching drain electrode D2 may be connected to the driving source electrode S1.

The compensation thin film transistor T3, which is a dual thin film transistor, may include compensation gate electrodes G3 overlapping two compensation channel regions and may include the compensation source electrode S3 and the compensation drain electrode D3 arranged on both sides. The compensation thin film transistor T3 may be connected to the driving gate electrode G1 of the driving thin film transistor T1 via a node connection line 1174 described below.

The first initialization thin film transistor T4, which is a dual thin film transistor, may include first initialization gate electrodes G4 overlapping two first initialization channel regions and may include the first initialization source electrode S4 and the first initialization drain electrode D4 arranged on both sides.

The operation control thin film transistor T5 may include the operation control gate electrode G5 overlapping an operation control channel region, and the operation control source electrode S5 and the operation control drain electrode D5 disposed on both sides. The operation control drain electrode D5 may be connected to the driving source electrode S1.

The emission control thin film transistor T6 may include the emission control gate electrode G6 overlapping an emission control channel region, and the emission control source electrode S6 and the emission control drain electrode D6 disposed on both sides. The emission control source electrode S6 may be connected to the driving drain electrode D1.

The second initialization thin film transistor T7 may include the second initialization gate electrode G7 overlapping a second initialization channel region, and the second initialization source electrode S7 and the second initialization drain electrode D7 disposed on both sides.

The thin film transistors described above may be connected to signal lines, for example, the scan line SL, the previous scan line SL-1, the emission control line EL, and the data line DL, the initialization voltage line VL, and the driving voltage line PL.

The scan line SL, the previous scan line SL-1, the emission control line EL, and the driving gate electrode G1 may be arranged over the semiconductor layer 1130 described above with an insulating layer (insulating layers) therebetween.

The scan line SL may extend in the first direction (direction x). Some areas of the scan line SL may correspond to the switching and compensation gate electrodes G2 and G3, respectively. In an exemplary embodiment, areas of the scan line SL overlapping channel regions of the switching and compensation thin film transistors T2 and T3 may be the switching and compensation gate electrodes G2 and G3, respectively, for example.

The previous scan line SL-1 may extend in the first direction (direction x), and some areas thereof may correspond to the first and second initialization gate electrodes G4 and G7, respectively. In an exemplary embodiment, areas of the previous scan line SL-1 overlapping channel regions of the first and second initialization thin film transistors T4 and T7 may be the first and second initialization gate electrodes G4 and G7, respectively, for example.

The emission control line EL extends in the first direction (direction x). Some areas of the emission control line EL may correspond to the operation control and emission control gate electrodes G5 and G6, respectively. In an exemplary embodiment, areas of the emission control line EL overlapping channel regions of the operation control and emission control thin film transistors T5 and T6 may be the operation control and emission control gate electrodes G5 and G6, respectively, for example.

The driving gate electrode G1, which is a floating electrode, may be connected to the compensation thin film transistor T3 via the node connection line 1174 described above.

An electrode voltage line HL may be arranged over the scan line SL, the previous scan line SL-1, the emission control line EL, and the driving gate electrode G1 described above with an insulating layer (insulating layers) therebetween.

The electrode voltage line HL may extend in the first direction (direction x) to cross the data line DL and the driving voltage line PL. A portion of the electrode voltage line HL may cover at least a portion of the driving gate electrode G1 and may constitute the storage capacitor Cst together with the driving gate electrode G1. In an exemplary embodiment, the driving gate electrode G1 may be the lower electrode CE1 of the storage capacitor Cst, and a portion of the electrode voltage line HL may be the upper electrode CE2 of the storage capacitor Cst, for example.

The upper electrode CE2 of the storage capacitor Cst may be electrically connected to the driving voltage line PL. In this regard, the electrode voltage line HL may be connected to the driving voltage line PL arranged over the electrode voltage line HL via a contact hole CNT. Accordingly, the electrode voltage line HL may have the same voltage level (constant voltage) as that of the driving voltage line PL. In an exemplary embodiment, the electrode voltage line HL may have a constant voltage of +5 volts (V), for example. The electrode voltage line HL may be understood as a transverse driving voltage line.

The driving voltage line PL may extend in a second direction (direction y) crossing the first direction (direction x), and the electrode voltage line HL electrically connected to the driving voltage line PL may extend in the first direction (direction x). Accordingly, in a display area, a plurality of driving voltage lines PL and electrode voltage lines HL may constitute a mesh structure.

The data line DL, the driving voltage line PL, an initialization connection line 1173, and the node connection line 1174 may be arranged over the electrode voltage line HL with an insulating layer (insulating layers) therebetween.

The data line DL may extend in the second direction (direction y) and may be connected to the switching source electrode S2 of the switching thin film transistor T2 via a contact hole 1154. A portion of the data line DL may be understood as the switching source electrode S2.

The driving voltage line PL may extend in the second direction (direction y), and as described above, may be connected to the electrode voltage line HL via the contact hole CNT. Also, the driving voltage line PL may be connected to the operation control thin film transistor T5 via a contact hole 1155. The driving voltage line PL may be connected to the operation control drain electrode D5 via the contact hole 1155.

One end of the initialization connection line 1173 may be connected to the first and second initialization thin film transistors T4 and T7 via a contact hole 1152, and the other end may be connected to the initialization voltage line VL described below via a contact hole 1151.

One end of the node connection line 1174 may be connected to the compensation drain electrode D3 via a contact hole 1156, and the other end may be connected to the driving gate electrode G1 via a contact hole 1157.

The initialization voltage line VL may be arranged over the data line DL, the driving voltage line PL, the initialization connection line 1173, and the node connection line 1174 with an insulating layer (insulating layers) therebetween.

The initialization voltage line VL may extend in the first direction (direction x). The initialization voltage line VL may be connected to the first and second initialization thin film transistors T4 and T7 via the initialization connection line 1173. The initialization voltage line VL may have a constant voltage (for example, −2V).

The initialization voltage line VL may be arranged in the same layer as a pixel electrode 210 of the organic light-emitting diode OLED and may include the same material as that of the pixel electrode 210 of the organic light-emitting diode OLED. The pixel electrode 210 may be connected to the emission control thin film transistor T6. The pixel electrode 210 may be connected to a connection metal 1175 via a contact hole 1163, and the connection metal 1175 may be connected to the emission control drain electrode D6 via a contact hole 1153.

The initialization voltage line VL arranged in the same layer as the pixel electrode 210 has been described with reference to FIG. 6. However, in another exemplary embodiment, the initialization voltage line VL may be arranged in the same layer as the electrode voltage line HL.

Figure 7:
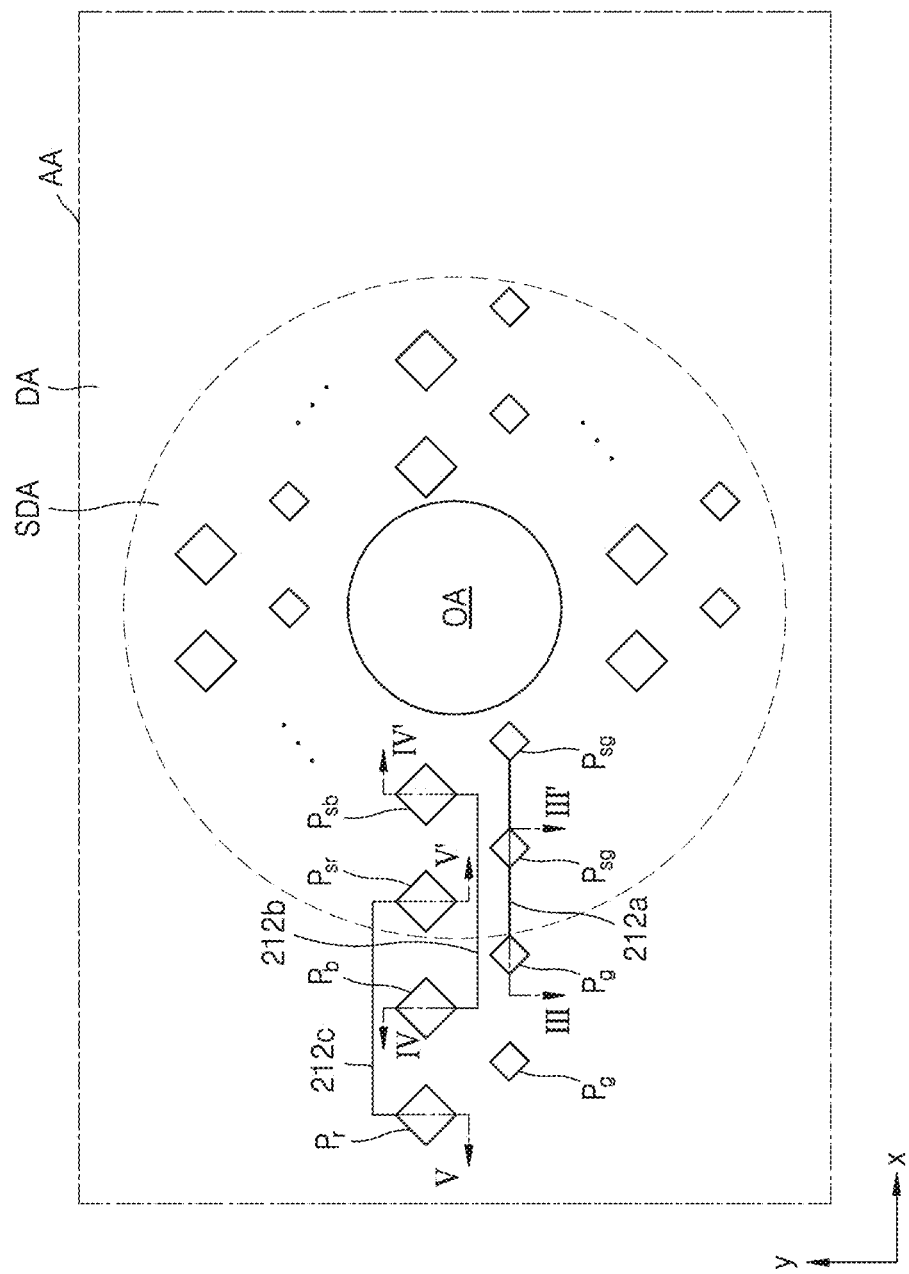
FIG. 7 is an enlarged plan view showing an exemplary embodiment of an exemplary embodiment that may correspond to an area AA of FIG. 3.

FIG. 7 is an enlarged plan view showing an exemplary embodiment that may correspond to an area AA of FIG. 3.

Referring to FIG. 7, the substrate 100 may include the opening area OA, the synchronization display area SDA surrounding the opening area OA, and the display area DA arranged outside the synchronization display area SDA. In an exemplary embodiment, the substrate 100 may further include the non-display area NDA arranged outside the display area DA.

A plurality of sub-pixels may be arranged in the display area DA. The plurality of sub-pixels arranged in the display area DA may surround the synchronization display area SDA. In an exemplary embodiment, a first sub-pixel Pg, a second sub-pixel Pb, and a third sub-pixel Pr may be arranged in the display area DA to surround the synchronization display area SDA. A plurality of synchronization sub-pixels may be arranged in the synchronization display area SDA. The plurality of synchronization sub-pixels arranged in the synchronization display area SDA may surround the opening area OA. In an exemplary embodiment, a first synchronization sub-pixel Psg, a second synchronization sub-pixel Psb, and a third synchronization sub-pixel Psr may be arranged in the synchronization display area SDA to surround the opening area OA.

The first sub-pixel Pg may emit light having a first wavelength, and the first synchronization sub-pixel Psg may be connected to the first sub-pixel Pg by a first conductive layer 212a and thus may emit light having the same first wavelength as the first sub-pixel Pg. The second sub-pixel Pb may emit light having a second wavelength, and the second synchronization sub-pixel Psb may be connected to the second sub-pixel Pb by a second conductive layer 212b and thus may emit light having the same second wavelength as the second sub-pixel Pb. The third sub-pixel Pr may emit light having a third wavelength, and the third synchronization sub-pixel Psr may be connected to the third sub-pixel Pr by a third conductive layer 212c and thus may emit light having the same third wavelength as the third sub-pixel Pr. In an exemplary embodiment, light having the first wavelength may be green, light having the second wavelength may be blue, and light having the third wavelength may be red, for example.

Figure 8A:
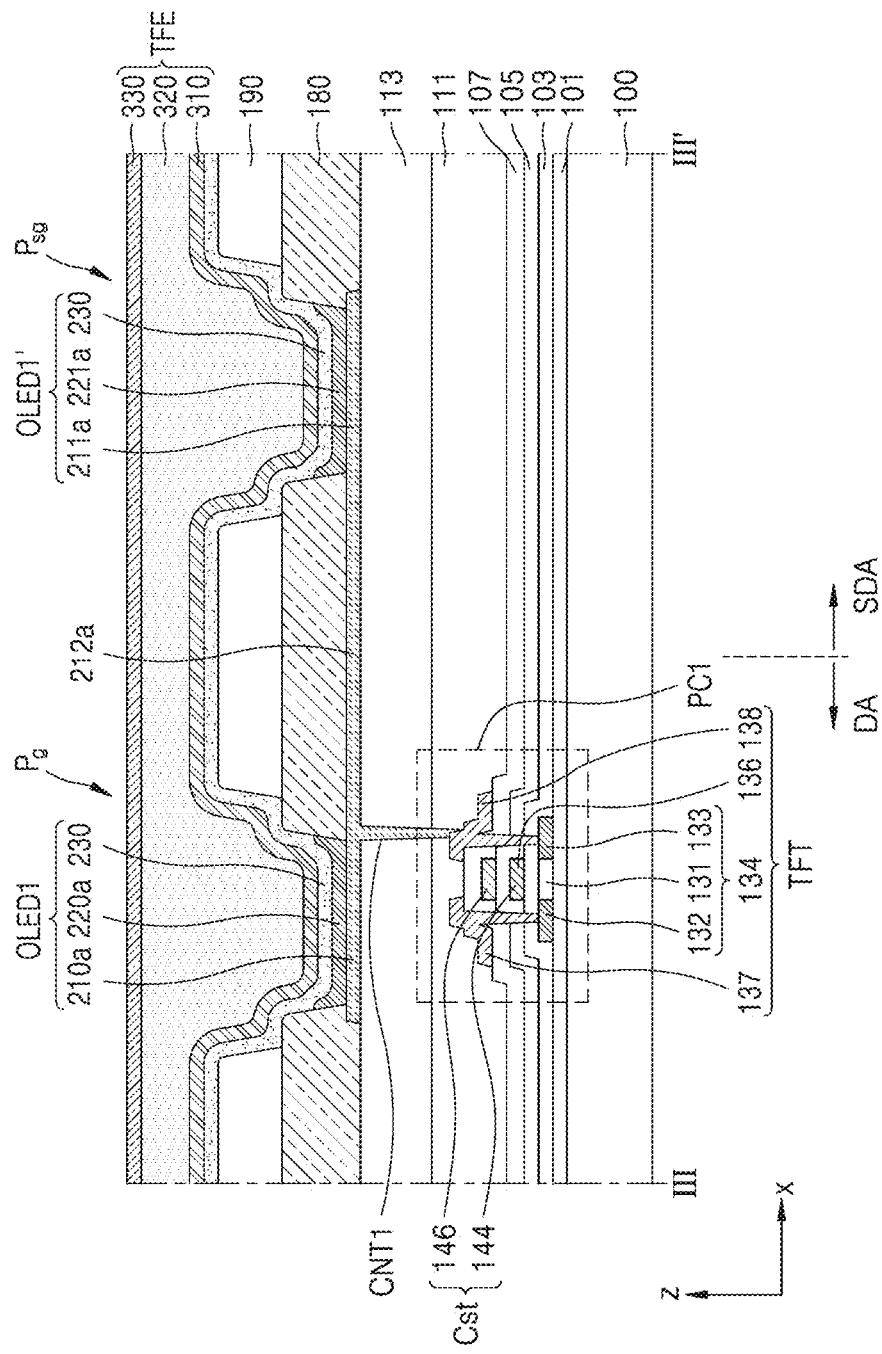
FIGS. 8A to 8C are schematic cross-sectional views of an exemplary embodiment of a display panel.
Figure 8B:
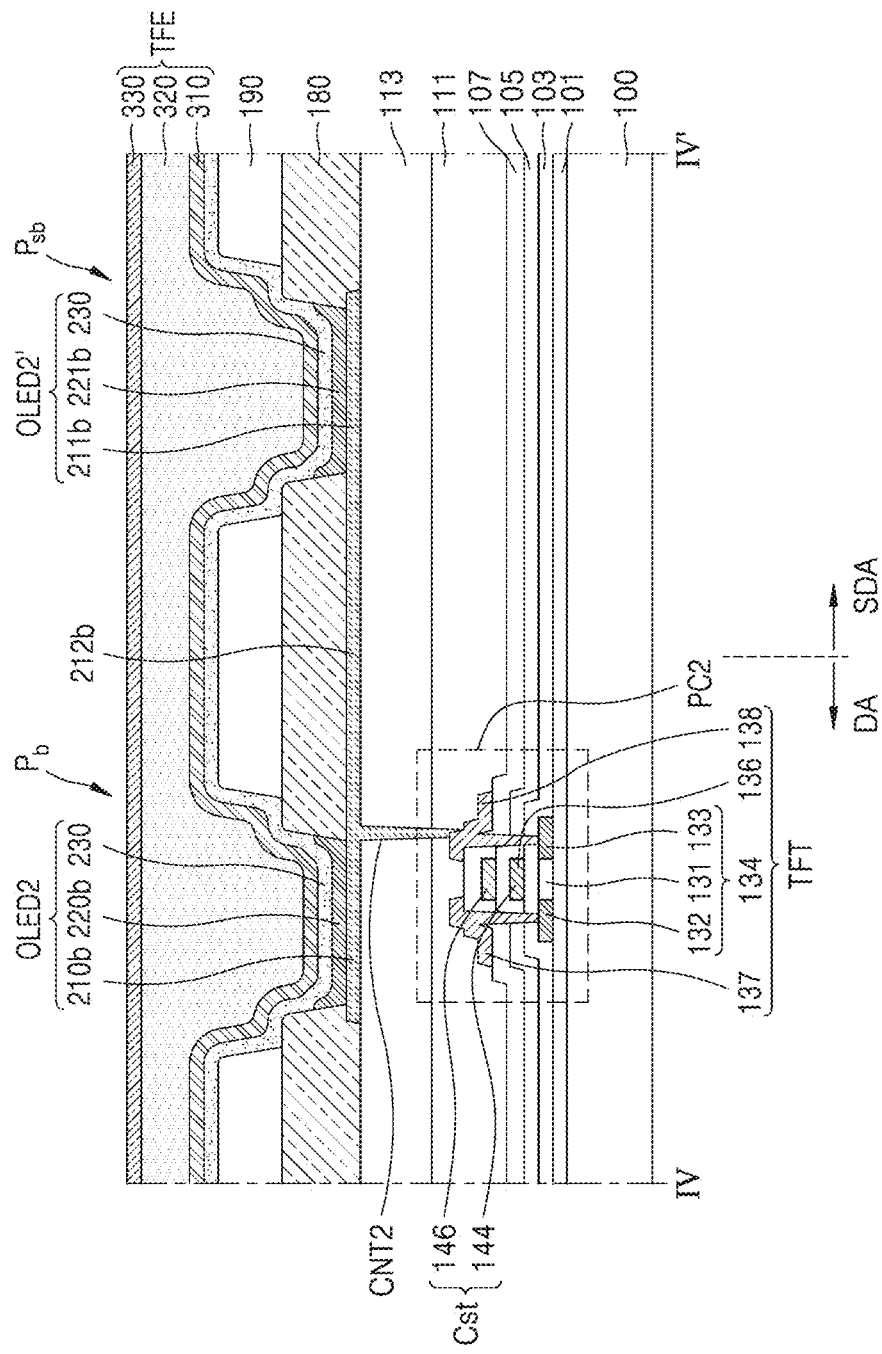
Figure 8C:
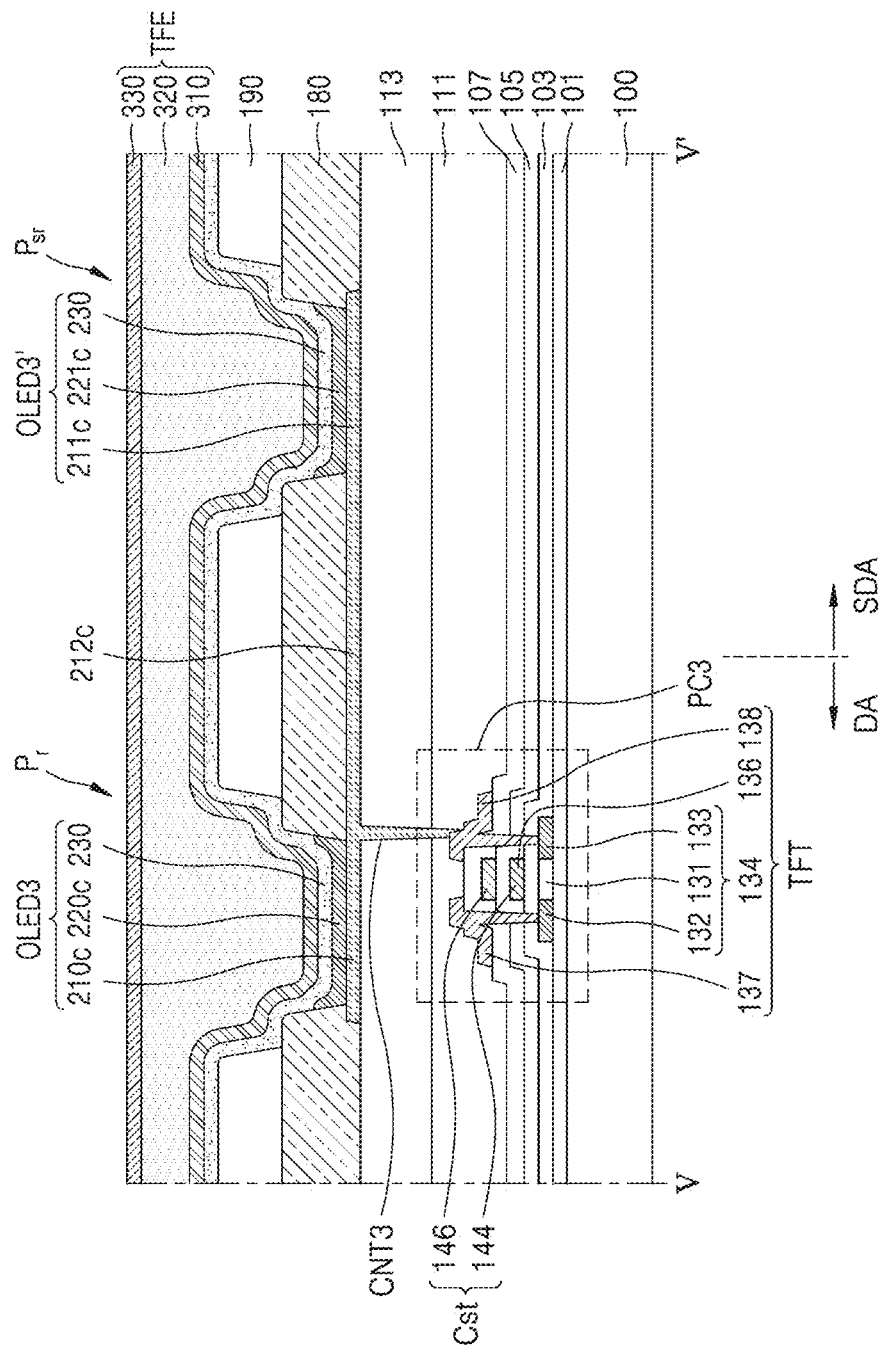

FIGS. 8A to 8C are schematic cross-sectional views of an exemplary embodiment of a display panel. More particularly, FIG. 8A is a schematic cross-sectional view of the display panel, taken along line of FIG. 7, FIG. 8B is a schematic cross-sectional view of the display panel, taken along line IV-IV' of FIG. 7, and FIG. 8C is a schematic cross-sectional view of the display panel, taken along line V-V' of FIG. 7.

Referring to FIG. 8A, a buffer layer 101 may be arranged on the substrate 100. The substrate 100 may include glass or polymer resin. In an exemplary embodiment, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate, for example. The substrate 100 including polymer resin may be flexible, rollable, or bendable. The substrate 100 may have a multilayer structure including a layer including the polymer resin described above and an inorganic layer (not shown). The buffer layer 101 may be disposed on the substrate 100 and thus may decrease or prevent penetration of foreign materials, moisture, or external air from the bottom of the substrate 100 and may provide a flat surface on the substrate 100. The buffer layer 101 may include an inorganic material, such as oxide or nitride, an organic material, or an organic-inorganic complex material, and may have a single-layer or multilayer structure of an inorganic material and an organic material. A barrier layer (not shown) for preventing penetration of external air may be further included between the substrate 100 and the buffer layer 101. The buffer layer 101 may be arranged over the display area DA and the synchronization display area SDA.

A first pixel circuit PC1 and a first organic light-emitting diode OLED1 electrically connected to the first pixel circuit PC1 may be arranged over the substrate 100 to correspond to the display area DA. The first pixel circuit PC1 may include a thin film transistor TFT and the storage capacitor Cst. The thin film transistor TFT of FIG. 8A may correspond to, for example, the driving thin film transistor T1.

The thin film transistor TFT may include a semiconductor layer 134, a gate electrode 136, a source electrode 137, and a drain electrode 138. The semiconductor layer 134 may include a channel region 131 overlapping the gate electrode 136, and a source region 132 and a drain region 133 arranged on both sides of the channel region 131 and including impurities having a higher concentration than those of the channel region 131. In this regard, the impurities may include N-type impurities or P-type impurities. The source region 132 and the drain region 133 may be electrically connected to the source electrode 137 and the drain electrode 138.

The semiconductor layer 134 may include an oxide semiconductor and/or a silicon semiconductor. When the semiconductor layer 134 includes an oxide semiconductor, the semiconductor layer 134 may include, for example, oxide of at least one material including indium (In), gallium (Ga), tin (Sn), zirconium (Zr), vanadium (V), hafnium (Hf), cadmium (Cd), germanium (Ge), chromium (Cr), titanium (TI), and zinc (Zn). In an exemplary embodiment, the semiconductor layer 134 may be InSnZnO ("ITZO"), InGaZnO ("IGZO"), etc., for example. When the semiconductor layer 134 includes a silicon semiconductor, the semiconductor layer 134 may include, for example, a-Si or LTPS obtained by crystallizing a-Si.

The gate electrode 136 may have a single-layer or multilayer structure including one or more metals including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line for applying an electrical signal to the gate electrode 136. In an exemplary embodiment, the gate electrode 136 may include the same material as that of first signal lines SGL1 (of FIG. 12) described below.

A gate insulating layer 103 may be arranged between the semiconductor layer 134 and the gate electrode 136, and thus, the semiconductor layer 134 and the gate electrode 136 may be insulated from each other. The gate insulating layer 103 may include at least one inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The gate insulating layer 103 may have a single-layer or multilayer structure including the inorganic insulating material described above.

The storage capacitor Cst may include a lower electrode 144 and an upper electrode 146 arranged over the lower electrode 144. The lower electrode 144 and the upper electrode 146 of the storage capacitor Cst may overlap each other. In an exemplary embodiment, the upper electrode 146 may include the same material as second signal lines SGL2 (of FIG. 12) described below.

A first interlayer insulating layer 105 may be arranged between the lower electrode 144 and the upper electrode 146. The first interlayer insulating layer 105, which is a layer having a predetermined dielectric constant, may be an inorganic insulating layer such as silicon oxynitride (SiON), silicon oxide ($SiO_x$) and/or silicon nitride ($SiN_x$) and may have a single-layer or multilayer structure.

FIG. 8A shows a case in which the storage capacitor Cst overlaps the thin film transistor TFT and the lower electrode 144 is unitary with the gate electrode 136 of the thin film transistor TFT. However, in another exemplary embodiment, the storage capacitor Cst may not overlap the thin film transistor TFT, and the lower electrode 144 may be an independent component separate from the gate electrode 136 of the thin film transistor TFT.

A second interlayer insulating layer 107 may be arranged on the upper electrode 146 of the storage capacitor Cst. The second interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may have a single-layer or multilayer structure.

The source electrode 137 and the drain electrode 138 may be arranged on the second interlayer insulating layer 107. The source electrode 137 and the drain electrode 138 may include a conductive material including molybdenum (Mo), aluminum (Al), copper (Cu), titanium (Ti), etc. and may have a multilayer or single-layer structure including the material described above. The source electrode 137 and the drain electrode 138 may have a multilayer structure of Ti/Al/Ti.

A planarization layer including a first planarization layer 111 and a second planarization layer 113 may be arranged on the source electrode 137 and the drain electrode 138. A first contact hole CNT1 may be defined in the planarization layer, and thus, a first pixel electrode 210a described below and the first pixel circuit PC1 may be electrically connected to each other via the first contact hole CNT1.

The first planarization layer 111 and the second planarization layer 113 may planarize an upper surface of the first pixel circuit PC1 and thus may planarize a surface on which the first organic light-emitting diode OLED1 is to be disposed. The first planarization layer 111 and the second planarization layer 113 may include a general commercial polymer such as benzocyclobutene ("BCB"), polyimide, hexamethyldisiloxane ("HMDSO"), poly(methyl methacrylate) ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The first planarization layer 111 and the second planarization layer 113 may include an inorganic material. The first planarization layer 111 and the second planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the first planarization layer 111 and the second planarization layer 113 include an inorganic material, chemical planarization polishing may be performed in some cases. The first planarization layer 111 and the second planarization layer 113 may include both of an organic material and an inorganic material.

In the display area DA of the substrate 100, the first organic light-emitting diode OLED1 including the first pixel electrode 210a, a first intermediate layer 220a, and an opposite electrode 230 facing the first pixel electrode 210a with the first intermediate layer 220a therebetween may be disposed on the second planarization layer 113.

The first pixel electrode 210a may be arranged on the second planarization layer 113. The first pixel electrode 210a may be a (semi)light-transmissive electrode or a reflective electrode. In some exemplary embodiments, the first pixel electrode 210a may include a reflective film including silver (Ag), magnesium (Mg), aluminum (Al), platinum (Pt), palladium (Pd), gold (Au), nickel (Ni), neodymium (Nd), iridium (Ir), chromium (Cr), and any combination thereof, and a transparent or semi-transparent electrode layer on the reflective film. The transparent or semi-transparent electrode layer may include at least one including indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In some exemplary embodiments, the first pixel electrode 210a may include a stacked structure of ITO/Ag/ITO.

A pixel-defining layer 180 may be arranged on the second planarization layer 113, and an opening exposing a central portion of the first pixel electrode 210a may be defined in the pixel-defining layer 180, and thus may define an emission area of the first sub-pixel Pg. Also, the pixel-defining layer 180 may prevent the occurrence of an arc at the edge of the first pixel electrode 210a by increasing a distance between the edge of the first pixel electrode 210a and the opposite electrode 230 arranged over the first pixel electrode 210a. The pixel-defining layer 180 may be provided by a method such as spin coating, using, for example, an organic insulating material such as polyimide, polyamide, acrylic resin, BCB, HMDSO, phenolic resin, etc.

A spacer 190 may be arranged on the pixel-defining layer 180. The spacer 190 may prevent the organic light-emitting diode OLED from being damaged by deflection of a mask during a manufacturing process using the mask. The spacer 190 may be provided by a method such as spin coating, using, for example, an organic insulating material such as polyimide, polyamide, acrylic resin, BCB, HMDSO, phenolic resin, etc. and may have a single-layer or multilayer structure.

The first intermediate layer 220a may be arranged on the first pixel electrode 210a exposed by the pixel-defining layer 180. The first intermediate layer 220a may include an emission layer and may selectively further include functional layers such as a hole transport layer ("HTL"), a hole injection layer ("HIL"), an electron transport layer ("ETL"), and an electron injection layer ("EIL").

The emission layer may include an organic material including a fluorescent or phosphorescent material emitting red, green, blue, or white light. The emission layer may include a low molecular weight organic material or a polymer organic material. In an exemplary embodiment, the emission layer included in the first intermediate layer 220a may include a material emitting green light, for example.

When the emission layer includes a low molecular weight organic material, the first intermediate layer 220a may have a structure in which an HIL, an HTL, an emission layer ("EML"), an ETL, an EIL, etc. are stacked in a single or complex structure, and may include various organic materials including copper phthalocyanine (CuPc), N,N'-Di(naphthalene-1-yl)-N,N'-diphenyl-benzidine ("NPB"), tris-8-hydroxyquinoline aluminum ($Alq_3$), etc. as a low molecular weight organic material. Such layers may be provided by vacuum deposition.

When the EML includes a polymer organic material, the first intermediate layer 220a may generally have a structure including an HTL and an EML. In this regard, the HTL may include poly(3,4-ethylenedioxythiophene) ("PEDOT"), and the EML may include a polymer material such as a polyphenylene vinylene ("PPV")-based material, a polyfluorene-based material, etc. The EML may be provided by screen printing or inkjet printing, laser induced thermal imaging ("LITI"), etc.

The first pixel electrode 210a may include a plurality of first pixel electrodes 210a, and the first intermediate layer 220a may correspond to each of the plurality of first pixel electrodes 210a. However, the invention is not limited thereto. Various modifications may be made, for example, the first intermediate layer 220a may include an integral layer over the plurality of first pixel electrodes 210a. In an exemplary embodiment, the first intermediate layer 220a may correspond to each of the plurality of first pixel electrodes 210a, and a functional layer (functional layers), except for the first intermediate layer 220a, may be unitary over the plurality of first pixel electrodes 210a.

The opposite electrode 230 may be arranged on the first intermediate layer 220a. The opposite electrode 230 may be arranged on the first intermediate layer 220a and may entirely cover the first intermediate layer 220a. The opposite electrode 230 may be arranged in the display area DA and may be arranged over an entire surface of the display area DA. That is, the opposite electrode 230 may be unitary to cover a plurality of pixels.

The opposite electrode 230 may be a light-transmissive electrode or a reflective electrode. In some exemplary embodiments, the opposite electrode 230 may be a transparent or semi-transparent electrode and may include a metal thin film having a low work function and including Li, Ca, LiF/Ca, LiF/Al, Al, Ag, Mg, and any combination thereof. Also, a transparent conductive oxide ("TCO") film such as ITO, IZO, ZnO, or $In_2O_3$ may be further arranged on the metal thin film.

When the first pixel electrode 210a is a reflective electrode, and the opposite electrode 230 is a light-transmissive electrode, light emitted from the first intermediate layer 220a may be emitted towards the opposite electrode 230, and thus, the display apparatus 1 may be a top emission-type apparatus. In another exemplary embodiment, when the first pixel electrode 210a is a transparent or semi-transparent electrode, and the opposite electrode 230 is a reflective electrode, light emitted from the first intermediate layer 220a may be emitted towards the substrate 100, and thus, the display apparatus 1 may be a bottom emission-type apparatus. However, the invention is not limited thereto, and the display apparatus 1 according to the illustrated exemplary embodiment may be a dual emission-type apparatus for emitting light in both of the top and bottom directions.

The buffer layer 101, the gate insulating layer 103, the first interlayer insulating layer 105, the second interlayer insulating layer 107, the first planarization layer 111, and the second planarization layer 113 arranged in the display area DA may each extend to the synchronization display area SDA.

A plurality of signal lines (of FIG. 12) described below may be arranged in the synchronization display area SDA. These will be described in detail with reference to FIG. 12.

A first synchronization organic light-emitting diode OLED1' including a first synchronization pixel electrode 211a, a first synchronization intermediate layer 221a, and the opposite electrode 230 facing the first synchronization pixel electrode 211a with the first synchronization intermediate layer 221a therebetween may be disposed on the second planarization layer 113 of the synchronization display area SDA.

The first pixel electrode 210a arranged in the display area DA and the first synchronization pixel electrode 211a arranged in the synchronization display area SDA may be connected to each other by the first conductive layer 212a. In an exemplary embodiment, the first pixel electrode 210a, the first synchronization pixel electrode 211a, and the first conductive layer 212a may include the same material. In an exemplary embodiment, the first synchronization pixel electrode 211a and the first conductive layer 212a may be portions where the first pixel electrode 210a extends to the synchronization display area SDA, for example.

The pixel-defining layer 180 may be arranged on the second planarization layer 113 of the synchronization display area SDA, and an opening exposing a central portion of the first synchronization pixel electrode 211a may be defined in the pixel-defining layer 180, and thus may define an emission area of the first synchronization sub-pixel Psg. The spacer 190 may be arranged on the pixel-defining layer 180.

The first synchronization intermediate layer 221a may be arranged on the first synchronization pixel electrode 211a exposed by the pixel-defining layer 180, and the opposite electrode 230 may be arranged on the first synchronization intermediate layer 221a. The first synchronization intermediate layer 221a may include an EML, and the EML included in the first synchronization intermediate layer 221a may include the same material as that of the EML of the first intermediate layer 220a arranged in the display area DA. In an exemplary embodiment, the first intermediate layer 220a arranged in the display area DA and the first synchronization intermediate layer 221a arranged in the synchronization display area SDA may include EMLs including the same material, and thus, the first sub-pixel Pg and the first synchronization sub-pixel Psg may emit light having the same wavelength, for example.

In an exemplary embodiment, the first sub-pixel Pg may include the first pixel circuit PC1 and the first organic light-emitting diode OLED1 connected to the first pixel circuit PC1 and thus may emit light having a first wavelength. As the first synchronization pixel electrode 211a of the first synchronization sub-pixel Psg is connected to the first pixel electrode 210a of the first sub-pixel Pg via the first conductive layer 212a, the first synchronization sub-pixel Psg may emit light simultaneously with the first sub-pixel Pg, and as the first synchronization intermediate layer 221a of the first synchronization sub-pixel Psg includes the same material as that of the first intermediate layer 220a of the first sub-pixel Pg, the first synchronization sub-pixel Psg may emit light having the same first wavelength as the first sub-pixel Pg.

A thin film encapsulation layer TFE may be arranged on the opposite electrode 230 to protect the organic light-emitting diode OLED from external moisture and oxygen. The thin film encapsulation layer TFE may include at least one organic encapsulation layer and at least one inorganic encapsulation layer. The thin film encapsulation layer TFE may cover the entire display area DA and may extend to the synchronization display area SDA and cover a portion of the synchronization display area SDA.

The thin film encapsulation layer TFE may include a first inorganic encapsulation layer 310, a second inorganic encapsulation layer 330 arranged over the first inorganic encapsulation layer 310, and an organic encapsulation layer 320 arranged between the first inorganic encapsulation layer 310 and the second inorganic encapsulation layer 330.

The first inorganic encapsulation layer 310 and the second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single-layer or multi-layer structure including the material described above. The first inorganic encapsulation layer 310 and the second inorganic encapsulation layer 330 may include the same material as each other or may include different materials from each other.

The organic encapsulation layer 320 may include a monomer-based material or a polymer-based material. The organic encapsulation layer 320 may include polyethylene terephthalate, polyethylene naphthalate, polycarbonate, polyimide, polyethylene sulfonate, polyoxymethylene, polyarylate, HMDSO, acryl-based resin (for example, PMMA, polyacrylic acid, etc.), or any combination thereof.

Referring to FIG. 8B, a second pixel circuit PC2 and a second organic light-emitting diode OLED2 electrically connected to the second pixel circuit PC2 may be arranged over the substrate 100 to correspond to the display area DA. The second pixel circuit PC2 may include the thin film transistor TFT and the storage capacitor Cst.

The thin film transistor TFT may include the semiconductor layer 134, the gate electrode 136, the source electrode 137, and the drain electrode 138. The buffer layer 101 may be arranged on the substrate 100, and the gate insulating layer 103 may be arranged on the buffer layer 101. The gate insulating layer 103 may be arranged between the semiconductor layer 134 and the gate electrode 136, and the first interlayer insulating layer 105 may be arranged between the gate electrode 136 and the source electrode 137.

A planarization layer including the first planarization layer 111 and the second planarization layer 113 may be arranged on the source electrode 137 and the drain electrode 138. A second contact hole CNT2 may be defined in the planarization layer, and thus, a second pixel electrode 210b described below and the second pixel circuit PC2 may be electrically connected to each other via the second contact hole CNT2.

In the display area DA of the substrate 100, the second organic light-emitting diode OLED2 including the second pixel electrode 210b, a second intermediate layer 220b, and the opposite electrode 230 facing the second pixel electrode 210b with the second intermediate layer 220b therebetween may be disposed on the second planarization layer 113.

The pixel-defining layer 180 may be arranged on the second planarization layer 113, and an opening exposing a central portion of the second pixel electrode 210b may be defined in the pixel-defining layer 180, and thus may define an emission area of the second sub-pixel Pb. The second intermediate layer 220b may be arranged on the second pixel electrode 210b exposed by the pixel-defining layer 180. The second intermediate layer 220b may include an EML. In an exemplary embodiment, the second intermediate layer 220b may include a material emitting blue light, for example. The opposite electrode 230 may be arranged on the second intermediate layer 220b.

A second synchronization organic light-emitting diode OLED2' including a second synchronization pixel electrode 211b, a second synchronization intermediate layer 221b, and the opposite electrode 230 facing the second synchronization pixel electrode 211b with the second synchronization intermediate layer 221b therebetween may be disposed on the second planarization layer 113 of the synchronization display area SDA.

The second pixel electrode 210b arranged in the display area DA and the second synchronization pixel electrode 211b arranged in the synchronization display area SDA may be connected to each other by the second conductive layer 212b. In an exemplary embodiment, the second pixel electrode 210b, the second synchronization pixel electrode 211b, and the second conductive layer 212b may include the same material. In an exemplary embodiment, the second synchronization pixel electrode 211b and the second conductive layer 212b may be portions where the second pixel electrode 210b extends to the synchronization display area SDA, for example.

The pixel-defining layer 180 may be arranged on the second planarization layer 113 of the synchronization display area SDA, and an opening exposing a central portion of the second synchronization pixel electrode 211b may be defined in the pixel-defining layer 180, and thus may define an emission area of the second synchronization sub-pixel Psb. The spacer 190 may be arranged on the pixel-defining layer 180.

The second synchronization intermediate layer 221b may be arranged on the second synchronization pixel electrode 211b exposed by the pixel-defining layer 180, and the opposite electrode 230 may be arranged on the second synchronization intermediate layer 221b. The second synchronization intermediate layer 221b may include an EML, and the EML included in the second synchronization intermediate layer 221b may include the same material as that of the EML of the second intermediate layer 220b arranged in the display area DA. In an exemplary embodiment, the second intermediate layer 220b arranged in the display area DA and the second synchronization intermediate layer 221b arranged in the synchronization display area SDA may include EMLs including the same material, and thus, the second sub-pixel Pb and the second synchronization sub-pixel Psb may emit light having the same wavelength, for example.

In an exemplary embodiment, the second sub-pixel Pb may include the second pixel circuit PC2 and the second organic light-emitting diode OLED2 connected to the second pixel circuit PC2 and thus may emit light having a second wavelength. As the second synchronization pixel electrode 211b of the second synchronization sub-pixel Psb is connected to the second pixel electrode 210b of the second sub-pixel Pb via the second conductive layer 212b, the second synchronization sub-pixel Psb and the second sub-pixel Pb may emit light simultaneously, and as the second synchronization intermediate layer 221b of the second synchronization sub-pixel Psb includes the same material as that of the second intermediate layer 220b of the second sub-pixel Pb, the second synchronization sub-pixel Psb may emit light having the same second wavelength as the second sub-pixel Pb.

Referring to FIG. 8C, a third pixel circuit PC3 and a third organic light-emitting diode OLED3 electrically connected to the third pixel circuit PC3 may be arranged over the substrate 100 to correspond to the display area DA. The third pixel circuit PC3 may include the thin film transistor TFT and the storage capacitor Cst.

The thin film transistor TFT may include the semiconductor layer 134, the gate electrode 136, the source electrode 137, and the drain electrode 138. The buffer layer 101 may be arranged on the substrate 100, and the gate insulating layer 103 may be arranged on the buffer layer 101. The gate insulating layer 103 may be arranged between the semiconductor layer 134 and the gate electrode 136, and the first interlayer insulating layer 105 may be arranged between the gate electrode 136 and the source electrode 137.

A planarization layer including the first planarization layer 111 and the second planarization layer 113 may be arranged on the source electrode 137 and the drain electrode 138. A third contact hole CNT3 may be defined in the planarization layer, and thus, a third pixel electrode 210c described below and the third pixel circuit PC3 may be electrically connected to each other via the third contact hole CNT3.

In the display area DA of the substrate 100, the third organic light-emitting diode OLED3 including the third pixel electrode 210c, a third intermediate layer 220c, and the opposite electrode 230 facing the third pixel electrode 210c with the third intermediate layer 220c therebetween may be disposed on the second planarization layer 113.

The pixel-defining layer 180 may be arranged on the second planarization layer 113, and an opening exposing a central portion of the third pixel electrode 210c may be defined in the pixel-defining layer 180, and thus may define an emission area of the third sub-pixel Pr. The third intermediate layer 220c may be arranged on the third pixel electrode 210c exposed by the pixel-defining layer 180. The third intermediate layer 220c may include an EML. In an exemplary embodiment, the third intermediate layer 220c may include a material emitting red light. The opposite electrode 230 may be arranged on the third intermediate layer 220c, for example.

A third synchronization organic light-emitting diode OLED3' including a third synchronization pixel electrode 211c, a third synchronization intermediate layer 221c, and the opposite electrode 230 facing the third synchronization pixel electrode 211c with the third synchronization intermediate layer 221c therebetween may be disposed on the second planarization layer 113 of the synchronization display area SDA.

The third pixel electrode 210c arranged in the display area DA and the third synchronization pixel electrode 211c arranged in the synchronization display area SDA may be connected to each other by the third conductive layer 212c. In an exemplary embodiment, the third pixel electrode 210c, the third synchronization pixel electrode 211c, and the third conductive layer 212c may include the same material. In an exemplary embodiment, the third synchronization pixel electrode 211c and the third conductive layer 212c may be portions where the third pixel electrode 210c extends to the synchronization display area SDA, for example.

The pixel-defining layer 180 may be arranged on the second planarization layer 113 of the synchronization display area SDA, and an opening exposing a central portion of the third synchronization pixel electrode 211c may be defined in the pixel-defining layer 180 and thus may define an emission area of the third synchronization sub-pixel Psr. The spacer 190 may be arranged on the pixel-defining layer 180.

The third synchronization intermediate layer 221c may be arranged on the third synchronization pixel electrode 211c exposed by the pixel-defining layer 180, and the opposite electrode 230 may be arranged on the third synchronization intermediate layer 221c. The third synchronization intermediate layer 221c may include an EML, and the EML included in the third synchronization intermediate layer 221c may include the same material as that of the EML of the third intermediate layer 220c arranged in the display area DA. In an exemplary embodiment, the third intermediate layer 220c arranged in the display area DA and the third synchronization intermediate layer 221c arranged in the synchronization display area SDA may include EMLs including the same material, and thus, the third sub-pixel Pr and the third synchronization sub-pixel Psr may emit light having the same wavelength, for example.

In an exemplary embodiment, the third sub-pixel Pr may include the third pixel circuit PC3 and the third organic light-emitting diode OLED3 connected to the third pixel circuit PC3 and thus may emit light having a third wavelength. As the third synchronization pixel electrode 211c of the third synchronization sub-pixel Psr is connected to the third pixel electrode 210c of the third sub-pixel Pr via the third conductive layer 212c, the third synchronization sub-pixel Psr and the third sub-pixel Pr may emit light simultaneously, and as the third synchronization intermediate layer 221c of the third synchronization sub-pixel Psr includes the same material as that of the third intermediate layer 220c of the third sub-pixel Pr, the third synchronization sub-pixel Psr may emit light having the same third wavelength as the third sub-pixel Pr.

Figure 9:
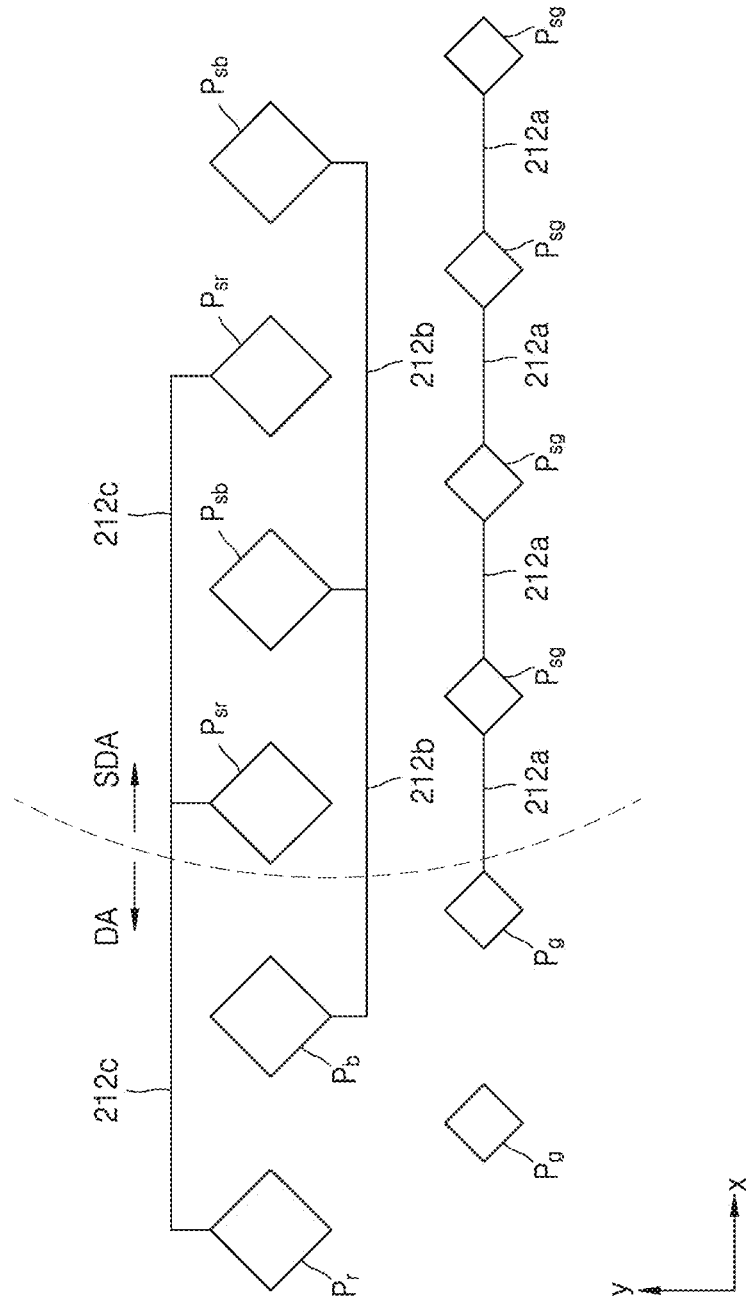
FIG. 9 is a plan view showing an exemplary embodiment of a plurality of pixels and a plurality of sub-pixels connected to each other in a display panel.

FIG. 9 is a plan view showing an exemplary embodiment of a plurality of pixels and a plurality of sub-pixels connected to each other in a display panel.

Referring to FIG. 9, a plurality of first synchronization sub-pixels Psg, a plurality of second synchronization sub-pixels Psb, and a plurality of third synchronization sub-pixels Psr may be arranged between the display area DA and the opening area OA.

The plurality of first synchronization sub-pixels Psg may be connected to one another by the first conductive layer 212a, and the first synchronization sub-pixel Psg arranged on an outermost side of the synchronization display area SDA may be connected to the first sub-pixel Pg arranged in the display area DA most adjacent to the synchronization display area SDA by the first conductive layer 212a.

Although FIG. 9 shows that only the first sub-pixel Pg most adjacent to the synchronization display area SDA is connected to the first synchronization sub-pixels Psg arranged in the synchronization display area SDA by the first conductive layer 212a in a PenTile structure, the invention is not limited thereto. A sub-pixel that is adjacent to the first sub-pixel Pg most adjacent to the synchronization display area SDA in the first direction (direction x) or the second direction (direction y) may also be connected to synchronization sub-pixels arranged in the synchronization display area SDA by a conductive layer.

The plurality of second synchronization sub-pixels Psb may be connected to each other by the second conductive layer 212b, and the second synchronization sub-pixel Psb arranged on an outermost side of the synchronization display area SDA may be connected to the second sub-pixel Pb arranged in the display area DA most adjacent to the synchronization display area SDA by the second conductive layer 212b.

The plurality of third synchronization sub-pixels Psr may be connected to each other by the third conductive layer 212c, and the third synchronization sub-pixel Psr arranged on an outermost side of the synchronization display area SDA may be connected to the third sub-pixel Pr arranged in the display area DA most adjacent to the synchronization display area SDA by the third conductive layer 212c.

Figure 10:
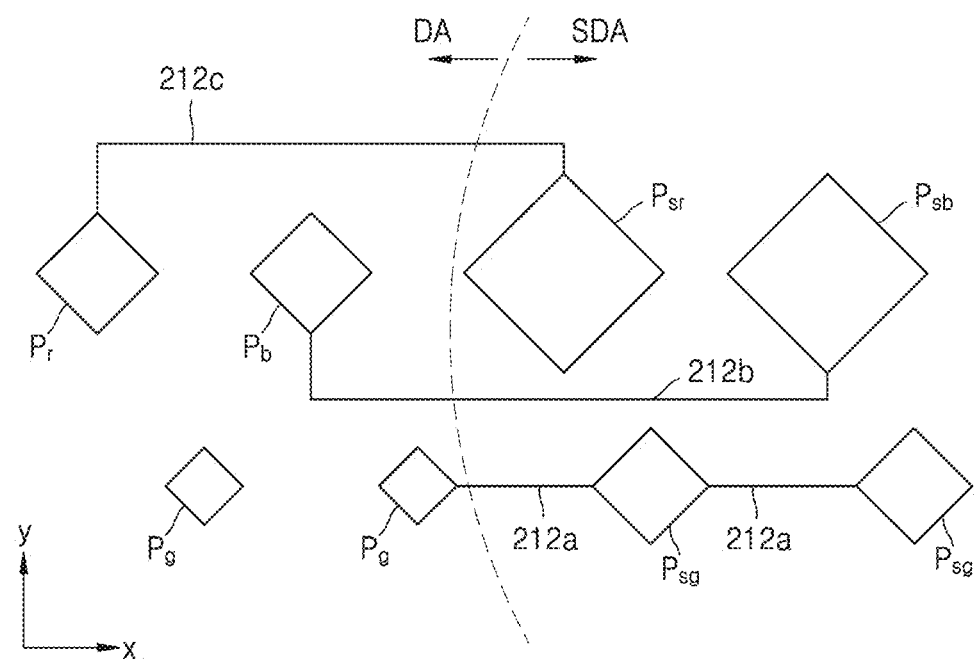
FIG. 10 is a plan view showing an exemplary embodiment of a plurality of pixels and a plurality of sub-pixels connected to each other in a display panel.

FIG. 10 is a plan view showing another exemplary embodiment of a plurality of pixels and a plurality of sub-pixels connected to each other in a display panel.

Referring to FIG. 10, areas of synchronization sub-pixels arranged in the synchronization display area SDA may be greater than those of sub-pixels arranged in the display area DA, and thus, image distortion of the sub-pixels arranged in the display area DA and the synchronization sub-pixels arranged in the synchronization display area SDA may be reduced.

Figure 11:
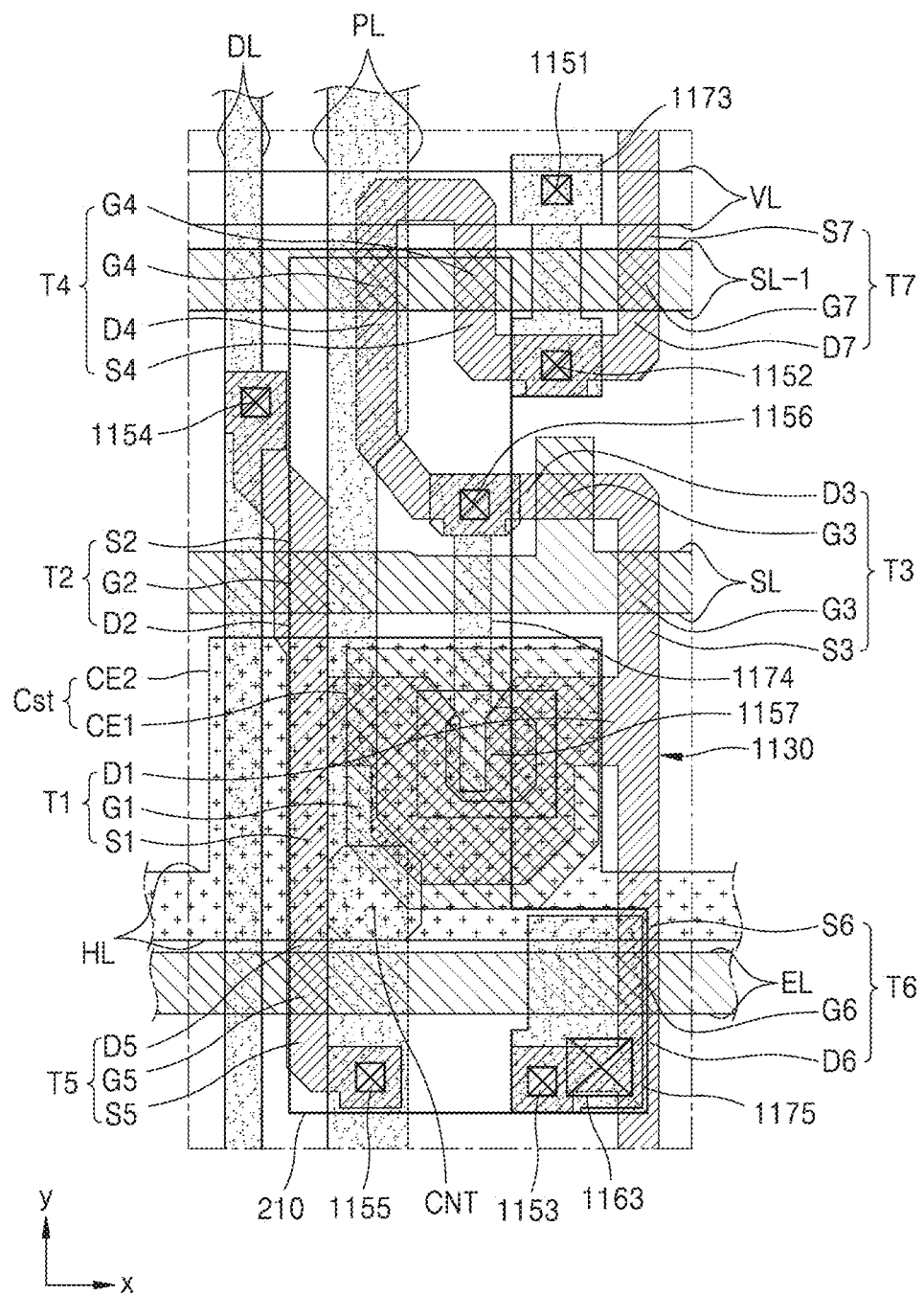
FIG. 11 is a plan view showing an exemplary embodiment of a sub-pixel of a display panel.

FIG. 11 is a plan view showing another exemplary embodiment of a sub-pixel of a display panel.

Referring to FIG. 11, brightness deviation of sub-pixels arranged in the display area DA and synchronization sub-pixels arranged in the synchronization display area SDA may be reduced by adjusting current distribution of a thin film transistor arranged in the display area DA most adjacent to the synchronization display area SDA. More particularly, brightness deviation between sub-pixels arranged in the display area DA and synchronization sub-pixels arranged in the synchronization display area SDA may be reduced by increasing a thickness of a channel of the driving thin film transistor T1 arranged in the display area DA most adjacent to the synchronization display area SDA to be greater than that of a channel of the driving thin film transistor T1 arranged in the display area DA.

Although not shown, the pixel circuit PC including seven thin film transistors and one storage capacitor may be arranged in the display area DA except for the display area DA most adjacent to the synchronization display area SDA, and by arranging the pixel circuit PC including two thin film transistors and one storage capacitor in the display area DA most adjacent to the synchronization display area SDA, brightness deviation between sub-pixels arranged in the display area DA and synchronization sub-pixels arranged in the synchronization display area SDA may be reduced, and space where synchronization sub-pixels may be arranged may be obtained.

Figure 12:
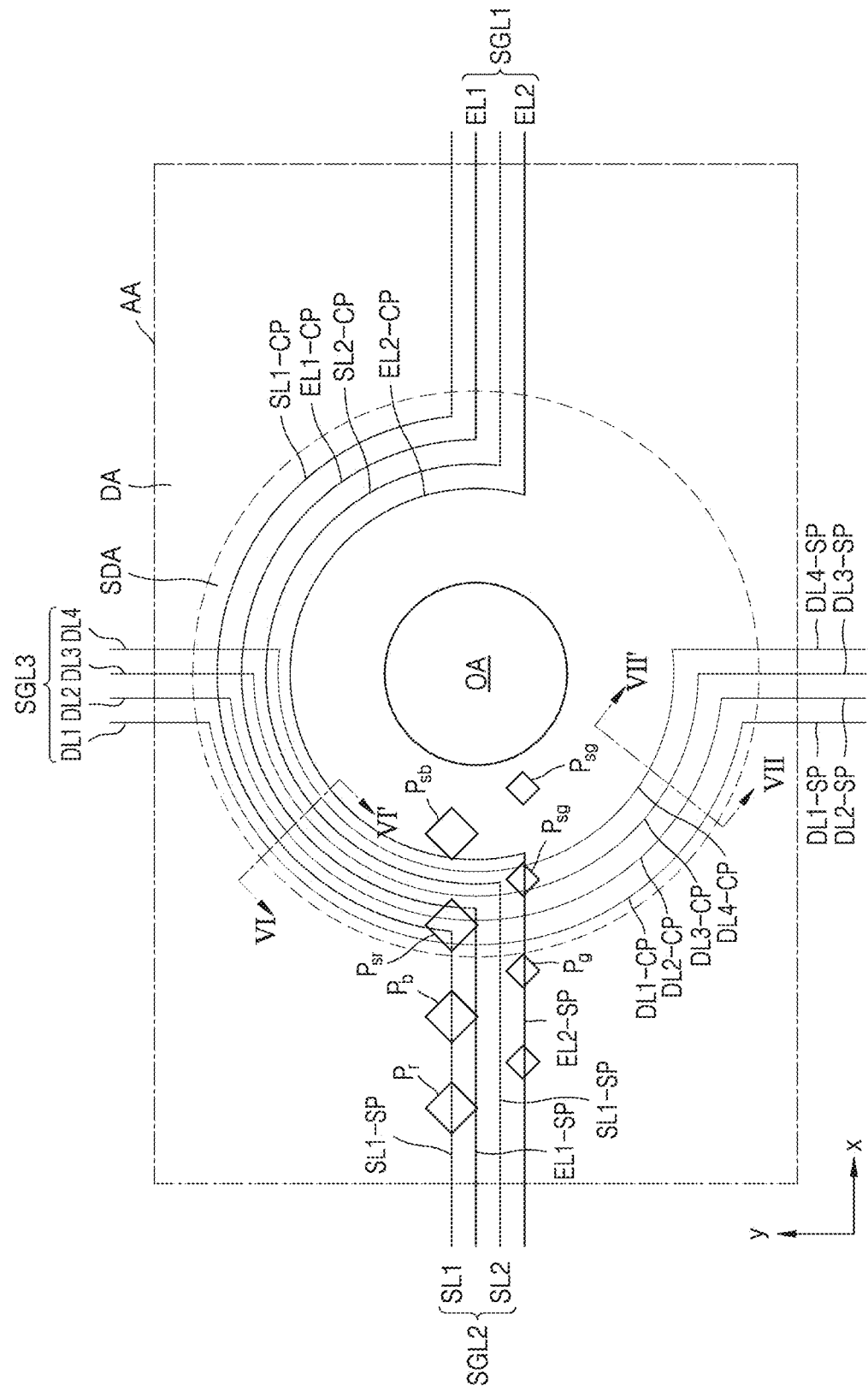
FIG. 12 is a plan view showing an exemplary embodiment of some of a plurality of signal lines bypassing an opening area.
Figure 13:
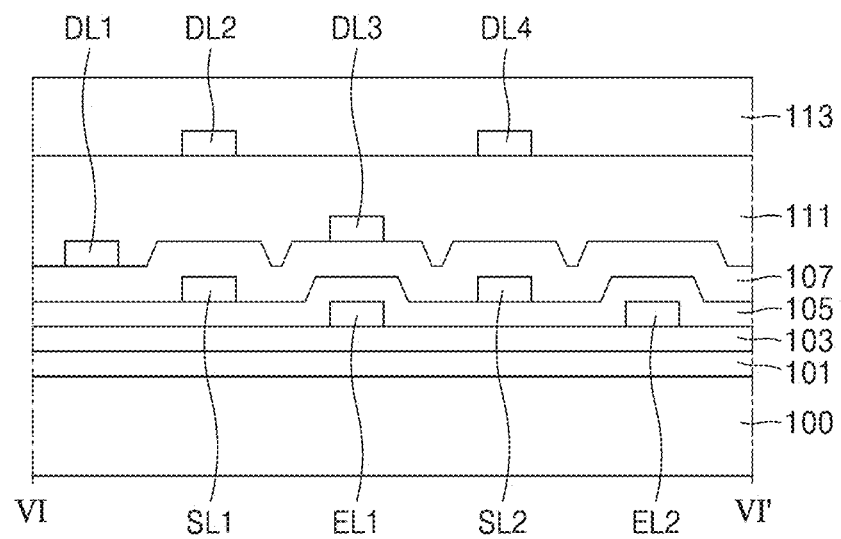
FIG. 13 is a cross-sectional view of some of the plurality of signal lines, taken along line VI-VI' of FIG. 12.
Figure 14:
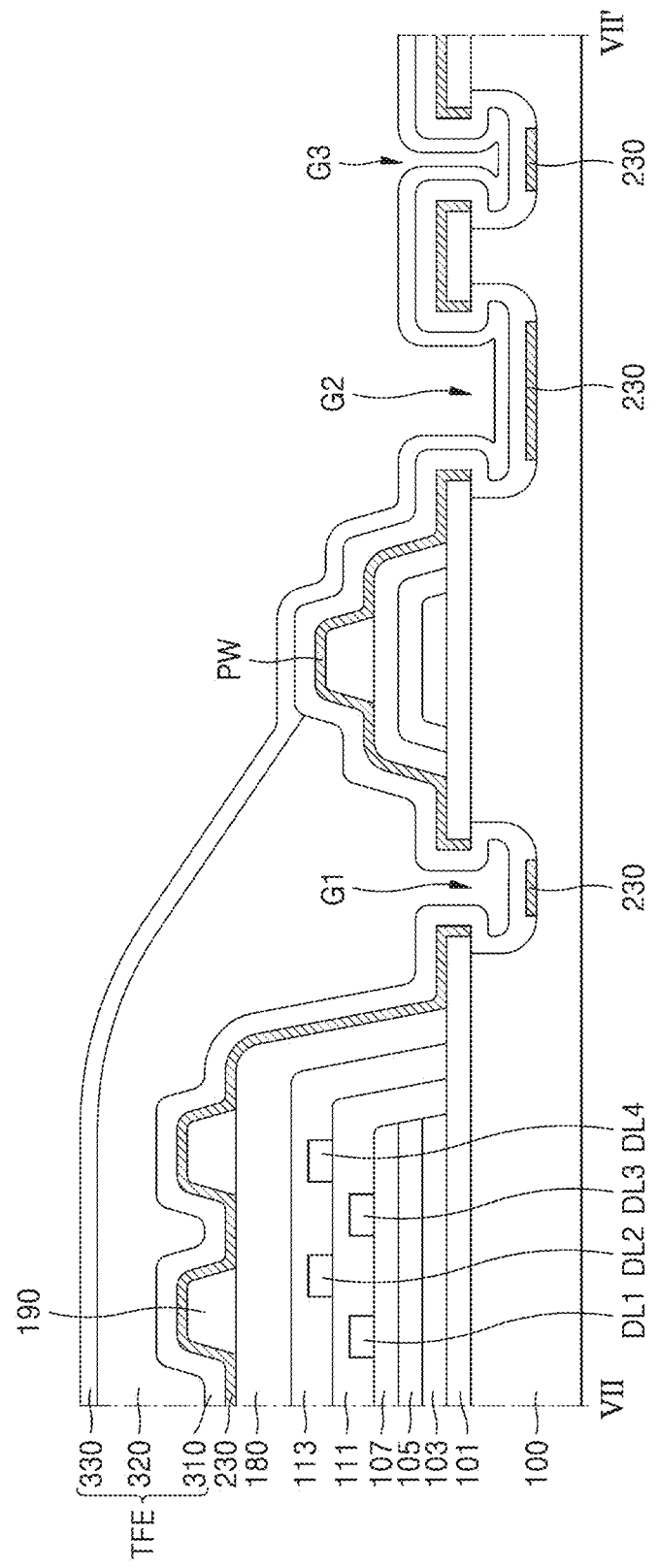
FIG. 14 is a cross-sectional view of some of the plurality of signal lines, taken along line VII-VII' of FIG. 12.

FIG. 12 is a plan view showing an exemplary embodiment of some of a plurality of signal lines bypassing an opening area. FIG. 13 is a cross-sectional view of some of the plurality of signal lines, taken along line VI-VI' of FIG. 12. FIG. 14 is a cross-sectional view of some of the plurality of signal lines, taken along line VII-VII' of FIG. 12.

Referring to FIG. 12, a plurality of signal lines may be arranged over the substrate 100, and the first synchronization sub-pixel Psg, the second synchronization sub-pixel Psb, and the third synchronization sub-pixel Psr may at least partially overlap the plurality of signal lines arranged over the substrate 100.

The first signal lines SGL1 from among the plurality of signal lines may extend in the first direction (direction x) and may have a bypass portion around the edge of the opening area OA. In an exemplary embodiment, the first signal lines SGL1 may be first and second emission control lines EL1 and EL2, and the first and second emission control lines EL1 and EL2 may include extension portions EL1-SP and EL2-SP extending in the first direction (direction x) and bypass portions EL1-CP and EL2-CP around the edge of the opening area OA.

The second signal lines SGL2 from among the plurality of signal lines may extend in the first direction (direction x) and may have a bypass portion around the edge of the opening area OA. In an exemplary embodiment, the second signal lines SGL2 may be first and second scan lines SL1 and SL2, and the first and second scan lines SL1 and SL2 may include extension portions SL1-SP and SL2-SP extending in the first direction (direction x) and bypass portions SL1-CP and SL2-CP around the edge of the opening area OA.

The third signal lines SGL3 from among the plurality of signal lines may extend in the second direction (direction y) crossing the first direction (direction x) and may have a bypass portion around the edge of the opening area OA. In an exemplary embodiment, the third signal lines SGL3 may be first to fourth data lines DL1 to DL4, and the first to fourth data lines DL1 to DL4 may include extension portions DL1-SP to DL4-SP extending in the second direction (direction y) and bypass portions DL1-CP to DL4-CP around the edge of the opening area OA.

Referring to FIG. 13, the first and second emission control lines EL1 and EL2 may be spaced apart from each other and be arranged on the gate insulating layer 103. In an exemplary embodiment, the first and second emission control lines EL1 and EL2 may include the same material as that of the gate electrode 136 described above. The first and second scan lines SL1 and SL2 may be spaced apart from each other and be arranged on the first interlayer insulating layer 105. In an exemplary embodiment, the first and second scan lines SL1 and SL2 may include the same material as that of the upper electrode 146 described above.

The first and third data lines DL1 and DL3 may be spaced apart from each other and be arranged on the second interlayer insulating layer 107, and the second and fourth data lines DL2 and DL4 may be spaced apart from each other and be arranged on the first planarization layer 111. In an exemplary embodiment, because neighboring data lines are arranged on different layers from each other, problems caused by coupling may be decreased, and dead space around the opening area OA may be reduced by decreasing a distance between data lines.

Referring to FIG. 14, a partition wall PW may be arranged in the synchronization display area SDA to surround the opening area OA, and at least one groove may be defined in the synchronization display area SDA to surround the opening area OA. The at least one groove G arranged in the synchronization display area SDA may include a first groove G1 adjacent to the display area DA with respect to the partition wall PW and a second groove G2 adjacent to the opening area OA. According to a selective embodiment, a third groove G3 between the opening area OA and the second groove G2 may be further included.

During a process of forming the first groove G1, the second groove G2, and the third groove G3, the substrate 100 and the buffer layer 101 arranged on the substrate 100 may be partially removed. Accordingly, the first groove G1, the second groove G2, and the third groove G3 may be defined after a buffer layer and a substrate are additionally arranged under the substrate 100.

The first inorganic encapsulation layer 310, the organic encapsulation layer 320, and the second inorganic encapsulation layer 330 arranged in the display area DA may extend to the synchronization display area SDA. In an exemplary embodiment, the organic encapsulation layer 320 may cover the first groove G1 arranged between the display area DA and the partition wall PW but may not be arranged over the partition wall PW, and the first inorganic encapsulation layer 310 and the second inorganic encapsulation layer 330 may contact each other over the partition wall PW and may be arranged in the second groove G2 and the third groove G3.

The opposite electrode 230 may be arranged throughout the synchronization display area SDA but may be disconnected by the first groove G1, the second groove G2, and the third groove G3. Penetration of moisture and spreading of a crack into a display apparatus may be prevented by disconnecting the opposite electrode 230 with the first groove G1, the second groove G2, and the third groove G3.

Although not shown, a functional layer including an HTL, an HIL, an ETL, and an EIL may be further arranged under the opposite electrode 230, and a capping layer for increasing light output efficiency may be further arranged on the opposite electrode 230. The functional layer and the capping layer arranged under and on the opposite electrode 230 may also be disconnected by the first groove G1, the second groove G2, and the third groove G3.

According to one or more embodiments, in a display panel of the related art, by arranging a synchronization sub-pixel between an area where an electronic element such as a camera or a sensor is arranged and a display area, dead space may be decreased, and further, a display panel having improved product reliability may be provided.

However, the invention is not limited by such an effect.

It should be understood that embodiments described herein should be considered in a descriptive sense only and not for purposes of limitation. Descriptions of features within each exemplary embodiment should typically be considered as available for other similar features in other exemplary embodiments. While one or more embodiments have been described with reference to the drawing figures, it will be understood by those of ordinary skill in the art that various changes in form and details may be made therein without departing from the spirit and scope as defined by the following claims.

What is claimed is:

1. A display panel comprising:
    a substrate comprising an area overlapping a camera or a sensor, a synchronization display area surrounding the area overlapping the camera or the sensor, and a display area arranged on a periphery of the synchronization display area;
    a plurality of signal lines arranged over the substrate;
    a first sub-pixel comprising a first pixel electrode arranged in the display area or the synchronization display area and a first intermediate layer which is arranged on the first pixel electrode and emits light having a first wavelength;
    a first synchronization sub-pixel comprising a first synchronization pixel electrode arranged in the synchronization display area and a first synchronization intermediate layer which is arranged on the first synchronization pixel electrode and emits light having the first wavelength as the first sub-pixel; and
    a first conductive layer connecting the first pixel electrode to the first synchronization pixel electrode.

2. The display panel of claim 1, further comprising:
    a second sub-pixel comprising a second pixel electrode arranged in the display area and a second intermediate layer which is arranged on the second pixel electrode and emits light having a second wavelength;
    a second synchronization sub-pixel comprising a second synchronization pixel electrode arranged in the synchronization display area and a second synchronization intermediate layer which is arranged on the second synchronization pixel electrode and emits light having the second wavelength as the second sub-pixel; and
    a second conductive layer connecting the second pixel electrode to the second synchronization pixel electrode.

3. The display panel of claim 2, further comprising:
    a third sub-pixel comprising a third pixel electrode arranged in the display area and a third intermediate layer which is arranged on the third pixel electrode and emits light having a third wavelength;
    a third synchronization sub-pixel comprising a third synchronization pixel electrode arranged in the synchronization display area and a third synchronization intermediate layer which is arranged on the third synchronization pixel electrode and emits light having the third wavelength as the third sub-pixel; and
    a third conductive layer connecting the third pixel electrode to the third synchronization pixel electrode.

4. The display panel of claim 3, wherein the first pixel electrode and the first conductive layer comprise a same material, the second pixel electrode and the second conductive layer comprise a same material, and the third pixel electrode and the third conductive layer comprise a same material.

5. The display panel of claim 3, wherein the first synchronization sub-pixel, the second synchronization sub-pixel, and the third synchronization sub-pixel are arranged in the synchronization display area to surround the area overlapping the camera or the sensor.

6. The display panel of claim 3, wherein the first sub-pixel, the second sub-pixel, and the third sub-pixel are arranged in the display area to surround the synchronization display area.

7. The display panel of claim 3, wherein the first synchronization sub-pixel, the second synchronization sub-pixel, and the third synchronization sub-pixel at least partially overlap the plurality of signal lines and are arranged over the substrate.

8. The display panel of claim 3, further comprising a planarization layer which is arranged over the substrate and in which a first contact hole, a second contact hole, and a third contact hole are defined,
    wherein the first sub-pixel further comprises a first pixel circuit electrically connected to the first pixel electrode via the first contact hole, the second sub-pixel further comprises a second pixel circuit electrically connected to the second pixel electrode via the second contact hole, and the third sub-pixel further comprises a third pixel circuit electrically connected to the third pixel electrode via the third contact hole.

9. The display panel of claim 8, wherein each of the first pixel circuit, the second pixel circuit, and the third pixel circuit comprises:
   a thin film transistor comprising a semiconductor layer, a gate electrode insulated from the semiconductor layer, and a source electrode and a drain electrode insulated from the gate electrode; and
   a storage capacitor comprising a lower electrode and an upper electrode arranged over the lower electrode.

10. The display panel of claim 9, wherein the plurality of signal lines comprises first signal lines extending in a first direction, the display panel further comprising a bypass portion around an edge of the area overlapping the camera or the sensor,
   wherein the first signal lines comprise a same material as a material of the gate electrode.

11. The display panel of claim 10, wherein the plurality of signal lines comprises second signal lines extending in the first direction, the display panel further comprising a bypass portion around the edge of the area overlapping the camera or the sensor,
   wherein the second signal lines comprise a same material as a material of the upper electrode.

12. The display panel of claim 11, wherein the plurality of signal lines comprises third signal lines extending in a second direction crossing the first direction, the display panel further comprising a bypass portion around the edge of the area overlapping the camera or the sensor,
   wherein neighboring third signal lines from among the third signal lines are arranged on different layers from each other.

13. The display panel of claim 3, further comprising a partition wall arranged in the synchronization display area to surround the area overlapping the camera or the sensor.

14. The display panel of claim 13, further comprising at least one groove arranged in the synchronization display area to surround the area overlapping the camera or the sensor,
   wherein the at least one groove comprises: a first groove adjacent to the display area with respect to the partition wall; and
   a second groove adjacent to the area overlapping the camera or the sensor.

15. The display panel of claim 14, further comprising a thin film encapsulation layer arranged on the first sub-pixel, the second sub-pixel, and the third sub-pixel and comprising at least one inorganic encapsulation layer and at least one organic encapsulation layer,
   wherein the at least one organic encapsulation layer extends to the synchronization display area and covers the first groove.

16. A display panel comprising:
   a substrate comprising an area overlapping the camera or the sensor, a synchronization display area surrounding the area overlapping the camera or the sensor, and a display area arranged on a periphery of the synchronization display area;
   a plurality of signal lines arranged over the substrate;
   a sub-pixel comprising a pixel electrode arranged in the display area or the synchronization display area, an intermediate layer arranged on the pixel electrode, and an opposite electrode arranged on the intermediate layer and at least partially extending to the synchronization display area;
   a synchronization sub-pixel comprising a synchronization pixel electrode arranged in the synchronization display area, a synchronization intermediate layer arranged on the synchronization pixel electrode, and the opposite electrode which is arranged on the synchronization intermediate layer and emits light having a same wavelength as a wavelength of the sub-pixel; and
   a conductive layer connecting the pixel electrode to the synchronization pixel electrode.

17. The display panel of claim 16, wherein the sub-pixel comprises a first sub-pixel, a second sub-pixel, and a third sub-pixel, and
   the synchronization sub-pixel further comprises a first synchronization sub-pixel, a second synchronization sub-pixel, and a third synchronization sub-pixel,
   wherein the first sub-pixel and the first synchronization sub-pixel emit light having a first wavelength, the second sub-pixel and the second synchronization sub-pixel emit light having a second wavelength, and the third sub-pixel and the third synchronization sub-pixel emit light having a third wavelength.

18. The display panel of claim 17, wherein the first synchronization sub-pixel, the second synchronization sub-pixel, and the third synchronization sub-pixel are arranged in the synchronization display area to surround the area overlapping the camera or the sensor.

19. The display panel of claim 17, wherein the first sub-pixel, the second sub-pixel, and the third sub-pixel are arranged in the display area to surround the synchronization display area.

20. The display panel of claim 17, wherein the first synchronization sub-pixel, the second synchronization sub-pixel, and the third synchronization sub-pixel at least partially overlap the plurality of signal lines and are arranged over the substrate.

* * * * *

UNITED STATES PATENT AND TRADEMARK OFFICE
CERTIFICATE OF CORRECTION

| | |
|---|---|
| PATENT NO. | : 11,581,379 B2 |
| APPLICATION NO. | : 16/922218 |
| DATED | : February 14, 2023 |
| INVENTOR(S) | : Sanghoon Lee et al. |

It is certified that error appears in the above-identified patent and that said Letters Patent is hereby corrected as shown below:

In the Claims

In Claim 16:
Column 30, Line 5 delete "the" and insert --a-- before camera; and Line 6 delete "the" and insert --a-- before sensor Signed and Sealed this
Eighth Day of August, 2023

Katherine Kelly Vidal
*Director of the United States Patent and Trademark Office*